(12) United States Patent
Nakagawa et al.

(10) Patent No.: US 9,190,287 B2
(45) Date of Patent: Nov. 17, 2015

(54) METHOD OF FABRICATING FIN FET AND METHOD OF FABRICATING DEVICE

(71) Applicant: CANON ANELVA CORPORATION, Kawasaki-shi (JP)

(72) Inventors: Takashi Nakagawa, Hachioji (JP); Masayoshi Ikeda, Hachioji (JP); Yukito Nakagawa, Kokubunji (JP); Yasushi Kamiya, Fuchu (JP); Yoshimitsu Kodaira, Tama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 14/159,763

(22) Filed: Jan. 21, 2014

(65) Prior Publication Data

US 2014/0206197 A1    Jul. 24, 2014

(30) Foreign Application Priority Data

Jan. 24, 2013    (JP) .................................. 2013-011096

(51) Int. Cl.
*H01L 21/302* (2006.01)
*H01L 21/3065* (2006.01)
(Continued)

(52) U.S. Cl.
CPC ....... *H01L 21/3065* (2013.01); *H01J 37/32357* (2013.01); *H01J 37/32403* (2013.01); *H01J 37/32422* (2013.01); *H01J 37/32458* (2013.01); *H01J 37/32715* (2013.01); *H01L 29/66795* (2013.01); *H01L 29/66803* (2013.01)

(58) Field of Classification Search
CPC ............ H01L 21/3065; H01L 21/3083; H01L 21/3086; H01L 21/3115; H01L 21/308; C23C 18/30; C23C 18/32
USPC ......... 438/135, 136, 197, 302, 513, 707, 709, 438/716; 216/58, 62, 66
See application file for complete search history.

(56) References Cited

U.S. PATENT DOCUMENTS

| | | | |
|---|---|---|---|
| 6,858,478 | B2 | 2/2005 | Chau et al. |
| 6,914,295 | B2 | 7/2005 | Chau et al. |
| 6,972,467 | B2 | 12/2005 | Zhang et al. |

(Continued)

FOREIGN PATENT DOCUMENTS

| | | |
|---|---|---|
| CN | 102117737 A | 7/2011 |
| JP | 2006-209128 A | 8/2006 |

(Continued)

OTHER PUBLICATIONS

U.S. Appl. No. 14/185,116, filed Feb. 20, 2014, Ikeda et al.

(Continued)

*Primary Examiner* — Lah Vinh
(74) *Attorney, Agent, or Firm* — Fitzpatrick, Cella, Harper & Scinto

(57) ABSTRACT

In fin FET fabrication, side walls of a semiconductor fin formed on a substrate have certain roughness. Using such fins having roughness may induce variations in characteristics between transistors due to their shapes or the like. An object of the present invention is to provide a fin FET fabrication method capable of improving device characteristic by easily reducing the roughness of the side walls of fins after formation. In one embodiment of the present invention, side walls of a semiconductor fin are etched by an ion beam extracted from a grid to reduce the roughness of the side walls.

10 Claims, 16 Drawing Sheets

(51) Int. Cl.
*H01J 37/32* (2006.01)
*H01L 29/66* (2006.01)

(56) References Cited

U.S. PATENT DOCUMENTS

| | | | |
|---|---|---|---|
| 7,005,366 | B2 | 2/2006 | Chau et al. |
| 7,071,064 | B2 | 7/2006 | Doyle et al. |
| 7,348,576 | B2 | 3/2008 | Gupta et al. |
| 7,358,121 | B2 | 4/2008 | Chau et al. |
| 7,368,791 | B2 | 5/2008 | Zhang et al. |
| 7,394,078 | B2 | 7/2008 | Gupta et al. |
| 7,427,794 | B2 | 9/2008 | Chau et al. |
| 7,504,678 | B2 | 3/2009 | Chau et al. |
| 7,514,346 | B2 | 4/2009 | Chau et al. |
| 7,560,756 | B2 | 7/2009 | Chau et al. |
| 7,790,334 | B2 | 9/2010 | Chandrachood et al. |
| 7,868,305 | B2 | 1/2011 | Gupta et al. |
| 8,378,576 | B2 | 2/2013 | Abarra et al. |
| 2006/0208202 | A1* | 9/2006 | Gupta et al. ............ 250/492.21 |
| 2006/0208204 | A1* | 9/2006 | Gupta et al. ............ 250/492.21 |
| 2006/0236931 | A1 | 10/2006 | Singh et al. |
| 2006/0278611 | A1* | 12/2006 | Sato et al. ............ 216/66 |
| 2008/0317968 | A1* | 12/2008 | Singh et al. ............ 427/523 |
| 2011/0084216 | A1* | 4/2011 | Hautala et al. ............ 250/398 |
| 2011/0147839 | A1* | 6/2011 | Yagishita et al. ............ 257/347 |

FOREIGN PATENT DOCUMENTS

| | | |
|---|---|---|
| JP | 2009-182360 A | 8/2009 |
| JP | 2011-181952 A | 9/2011 |
| JP | 2011-233594 A | 11/2011 |
| KR | 10-2008-0019260 A | 3/2008 |
| TW | 2007-10960 | 3/2007 |
| WO | 2013/027406 A1 | 2/2013 |

OTHER PUBLICATIONS

Notice of Preliminary Rejection in Korean Application No. 10-2014-0008986 (mailed Mar. 10, 2015).

Office Action in Taiwanese Application No. 103102777 (dated Jun. 11, 2015).

* cited by examiner

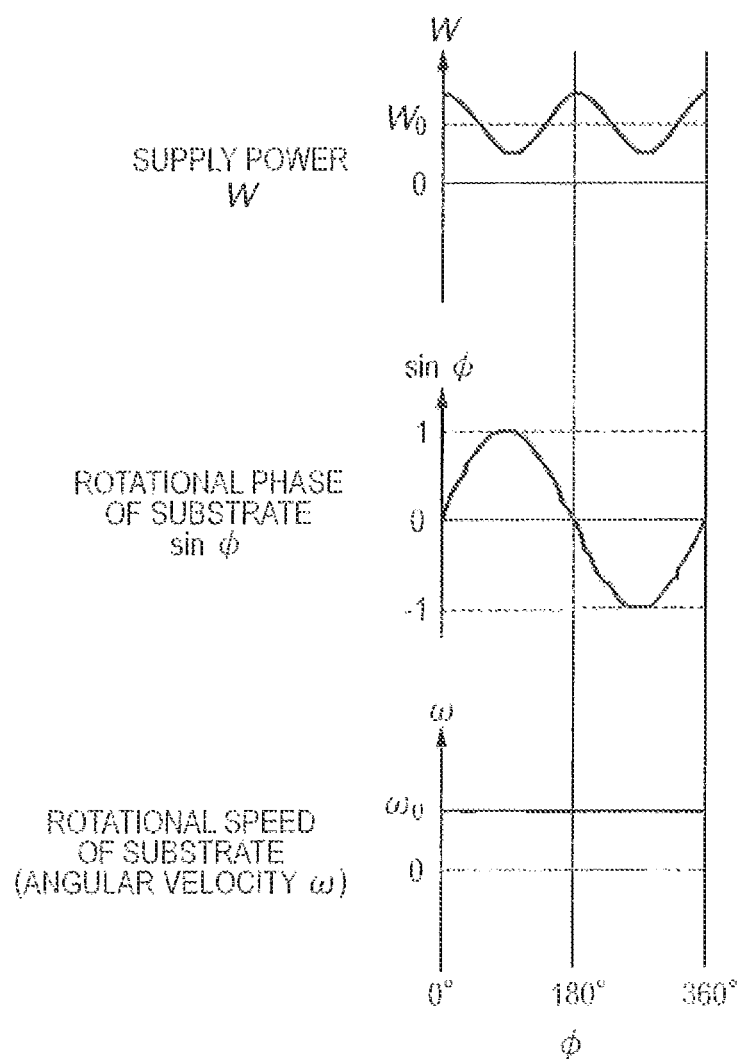

METHOD OF FABRICATING FIN FET AND METHOD OF FABRICATING DEVICE

CROSS-REFERENCES TO RELATED APPLICATIONS

This application is based upon and claims the benefit of priority of the prior Japanese Patent Application No. 2013-011096, filed Jan. 24, 2013. The contents of the aforementioned application are incorporated herein by reference in their entireties.

BACKGROUND OF THE INVENTION

1. Field of the Invention

The present invention relates to a device structure of a MOSFET.

2. Description of the Related Art

The market is demanding high-performance and low-cost radio frequency (RF) LSIs. In particular, there have been widely used device structures of MOSFETs provided with excellent RF characteristics by CMOS processes.

As transistor sizes are reduced in order to achieve high transistor densities, the short channel effect due to short gate lengths makes it difficult to control drain currents by gate voltages, and causes a phenomenon called punch-through. To inhibit this phenomenon and improve gate controllability, it is effective to employ a multigate MOSFET having gate electrodes disposed on both top and under sides of a channel portion, and being capable of fully controlling the channel by the gate electrodes. To realize this multigate structure, it is difficult to form a gate electrode on the under side of the channel portion by a conventional planar MOSFET fabrication method. For this reason, multigate field-effect transistors having structures in which gate electrodes are disposed on two opposite sides of a fin-shaped channel portion standing perpendicular to a substrate have been proposed, and the structures have been known as "fin FET" structures (e.g., JP-A 2009-182360 and JP-A 2011-181952).

In one of fin fabrication methods, for example, as disclosed in JP-A 2009-182360, predetermined regions of a semiconductor film made of Si, SiGe, or the like are etched using photoresist (hereinafter also referred to as PR) or the like, and a protruding portion between the etched regions is used as a fin.

Meanwhile, various structures of fines have been proposed, such as an I-shaped fin disclosed in JP-A 2009-182360 and a U-shaped fin disclosed in JP-A 2011-181952.

In the case where a thin film is etched to form a fin, certain roughness exists in side walls of the fin after processing. Use of fins having such roughness in transistors may cause a problem of variations in characteristics among the transistors due to their shapes or the like. As a method of reducing the roughness of side walls of a thin film after etching processing, a method disclosed in JP-A 2006-209128 has been known. In JP-A 2006-209128, before etching of a predetermined thin film, side walls of a patterned mask film provided on the thin film are covered with a carbon film to reduce roughness, and then the thin film is etched.

However, to reduce the roughness of the side walls, a certain amount or more of a carbon film needs to be deposited on the side walls. Accordingly, in the case where this method is applied to fin FETs required to have a high integration density, widths of grooves between patterned masks become so small that problems may occur such as the difficulty of etching a semiconductor film, and reductions in shape accuracy and size accuracy.

SUMMARY OF THE INVENTION

The present invention has been made in view of the above-described problems. An object of one present invention is to provide a fin FET fabrication method capable of improving device characteristics by easily reducing the roughness of side walls of fins after formation.

In order to solve the above-described problems, an aspect of the invention of the present application provides a method of fabricating a fin FET, the method including the steps of preparing a substrate which comprises a semiconductor fin thereon and ion-beam etching a side wall of the semiconductor fin formed on a substrate using an ion beam extracted from a grid.

Another aspect of the invention of the present application provides a method of fabricating a device, the method including the steps of preparing a substrate which comprises an element thereon and ion-beam etching a side wall of the element using an ion beam extracted from a grid, wherein in the ion beam etching step, the substrate is positioned with a tilt with respect to the grid, and ion beam etching is performed with an amount of energy of the ion beam set such that the ion beam incident in an extending direction of the element is larger than an amount of energy of the ion beam incident in any other direction.

Using the present invention, roughness existing in the side wall of the fin can be easily reduced to improve device characteristics.

BRIEF DESCRIPTION OF THE DRAWINGS

FIG. 14A is a view for explaining the fourth embodiment according to the present invention.

DESCRIPTION OF THE EMBODIMENTS

Figure 1:
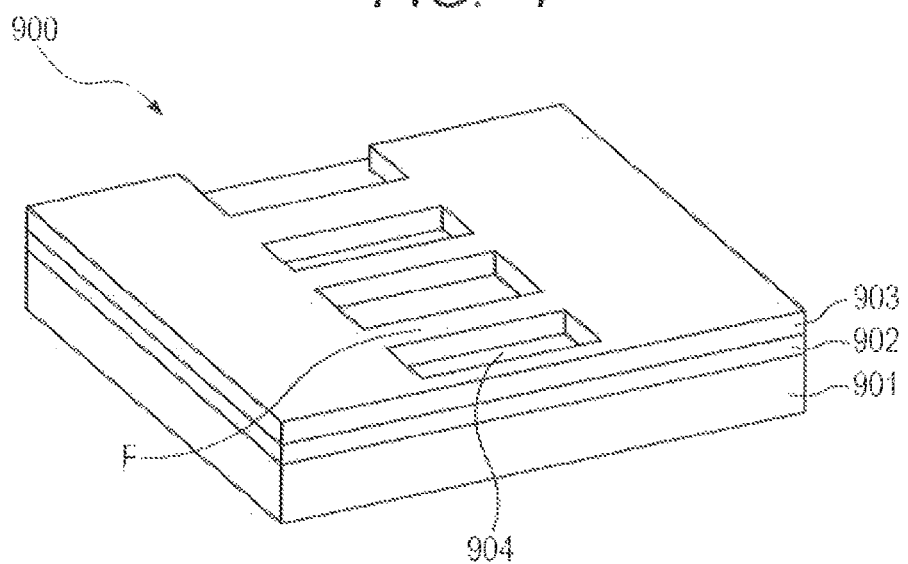
FIG. 1 is a view for explaining a fin FET to which the present invention can be applied.

Hereinafter, embodiments of the present invention will be described with reference to the drawings. However, the present invention is not limited to the embodiments, and can be appropriately modified without departing from the spirit thereof. It should be noted that components having the same function are denoted by the same reference numeral in the drawings to be explained below, and will not be repeatedly explained.

(Structure of Fin FET)

Referring to FIG. 1, an example of the structure of a fin FET to which the present invention can be applied and an example of a method of fabricating the same will be described. In FIG. 1, an insulating film 902 and a semiconductor film 903 are formed on a Si substrate 901, and trenches 904 are formed in the semiconductor film 903. In a method of forming the trenches 904, the trenches 904 are formed by applying a photoresist (hereinafter referred to as PR) to the semiconductor film 903, forming a predetermined pattern in the photoresist by lithography, and then transferring the pattern onto the semiconductor film 903. After that, by removing the PR, fins F are formed in regions on the semiconductor film 903 covered with the patterned RP. To etch the semiconductor film 903, reactive ion etching is favorably used.

The insulating film 902 is made of $SiO_2$, SiN, or the like. The semiconductor film 903 is made of Si, Ge, SiGe, or the like.

Figure 2:
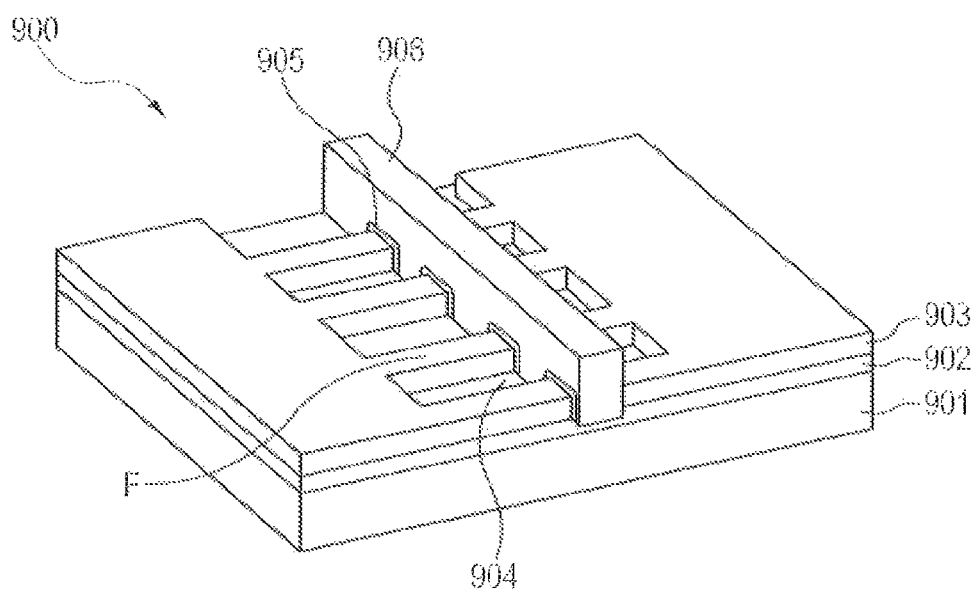
FIG. 2 is a view for explaining the fin FET to which the present invention can be applied.

Subsequently, as shown in FIG. 2, a gate dielectric film 905 and a gate electrode 906 are formed on predetermined regions of the fins F, the semiconductor film 903, and the trenches 904. The gate dielectric film 905 and the gate electrode 906 can be formed as follows: first, a gate dielectric film 905 and a gate electrode 906 are formed on the entire surface of the semiconductor film 903, and then predetermined regions are etched by lithography using a PR. The gate dielectric film 905 is made of $Ta_2O_5$, $TiO_2$, or other high-k dielectric (e.g., PZT, BST, or the like). The gate electrode 906 is made of polycrystalline Si, W, Ta, a metal nitride film, or the like.

First Embodiment

In the above-described fin FET fabrication, certain roughness exists in side walls (i.e., side walls of the fins F) of the trenches 904. In particular, line edge roughness (hereinafter referred to as LER) which is caused by the PR greatly impairs the flatness of the side walls. Therefore the roughness is desired to be removed. In the present invention, this roughness is reduced by applying an ion beam to the side walls of the fins F formed.

Figure 3:
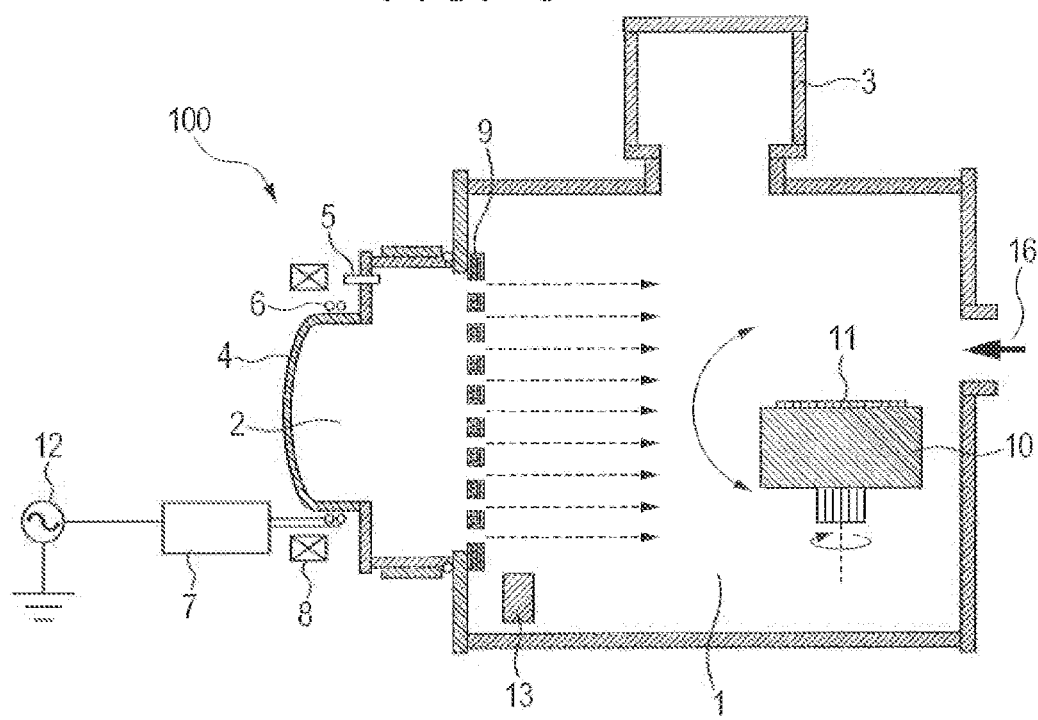
FIG. 3 is a view showing an IBE system according to one embodiment of the present invention.

FIG. 3 shows a schematic diagram of an ion beam etching (hereinafter referred to as IBE) system 100 which is favorably used in the present invention. The IBE system 100 includes a processing space 1 and a plasma generating portion 2 as a plasma source. The processing space 1 has a vacuum pump 3 disposed therein. The plasma generating portion 2 has a bell jar 4, a gas inlet 5, an RF antenna 6, a matching network 7, and an electromagnet 8 disposed therein. Furthers a grid 9 is disposed at the boundary between the processing space 1 and the plasma generating portion 2.

Figure 4:
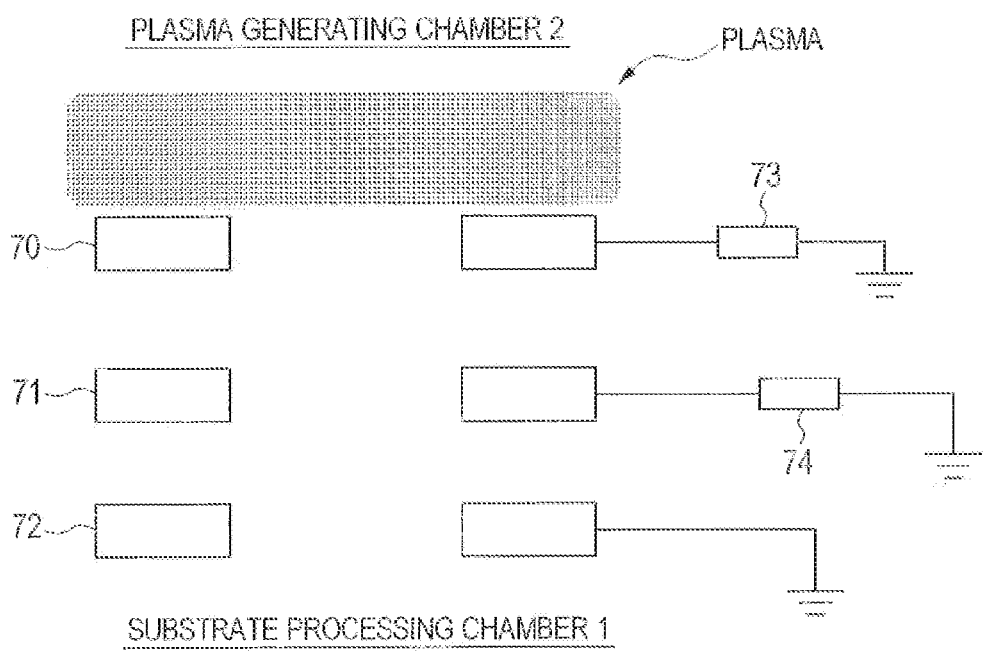
FIG. 4 is a view for explaining the configuration and functions of a grid according to one embodiment of the present invention.

The grid 9 includes plural electrodes. In the present invention, for example, three electrodes such as shown in FIG. 4 constitute the grid 9. The electrodes are referred to as a first electrode 70, a second electrode 71, and a third electrode 72 from the bell jar 4 side. The first electrode 70 is supplied with a positive voltage, and the second electrode 71 is supplied with a lower voltage than the first electrode 70. The potential difference accelerates ions. The third electrode 72 is grounded. Using an electrostatic lens effect, the diameter of the ion beam can be maintained within a predetermined range of values by controlling the potential difference between the second electrode 71 and the third electrode 72. The ion beam is neutralized by a neutralizer 13.

This grid 9 is preferably made of a material resistant to process gas. Examples of the material of the grid include molybdenum; titanium, titanium carbide, and pyrolitic graphite. Moreover, the grid 9 may be other material having a surface thereof coated with molybdenum, titanium, or titanium carbide.

In the processing space 1, a substrate holder 10 is provided, and an unillustrated ESC electrode is connected to the substrate holder 10. The ESC electrode allows a substrate 11 mounted on the substrate holder 10 to be fixed thereon by electrostatic attraction. Moreover, with regard to other substrate fixation means, various fixation means such as clamping can be used. A plasma can be produced from etching gas in the plasma generating portion 2 by introducing process gas through the gas inlet 5 and applying RF to the RF antenna 6. Further, the substrate 11 is processed by applying a direct-current voltage to the grid 9, extracting ions in the plasma generating portion 2 as a beam, and applying the beam to the substrate 11. The extracted ion beam is electrically neutralized by the neutralizer 13 and applied to the substrate 11.

The substrate holder 10 can rotate (spin) the substrate 11 about an axis perpendicular to the plane of the substrate 11. The substrate holder 10 includes rotation control means for controlling the rotational speed of the substrate 11, the number of revolutions of the substrate 11, and the tilt of the substrate holder 10 with respect to the grid 9, and means for detecting the rotational position of the substrate 11.

Moreover, the substrate holder 10 may further include means for detecting the tilt of the substrate holder 10 with respect to the grid 9. In this embodiment, a position sensor 14 (not shown) as position detection means is provided in the substrate holder 10, so that the rotational position of the substrate 11 can be detected. In this embodiment, a rotary encoder is used as the position sensor 14. Any means may be used as the position sensor 14 as long as the position sensor 14 can detect the rotational position of the substrate 11 rotating similarly to the above-described rotary encoder.

It should be noted that in this embodiment, the rotational position of the substrate 11 held by the substrate holder 10 is detected by directly detecting the rotational position of the substrate 11 or the substrate holder 10 using a sensor such as the position sensor 14. However, any means may be employed as long as the rotational position of the substrate 11 can be detected. The rotational position of the substrate 11 may be indirectly found by a method in which, for example, the rotational position of the substrate 11 is calculated from the rotational speed and rotation time of the substrate holder 10.

In the present invention, the rotational position of the substrate 11 is found by detecting an orientation flat or a notch of the substrate 11. Alternatively, by detecting an alignment mark or a pattern arrangement provided on the substrate 11, the rotational position can be found with higher accuracy. The substrate holder 10 can be tilted with respect to the ion beam as desired.

Figure 5:
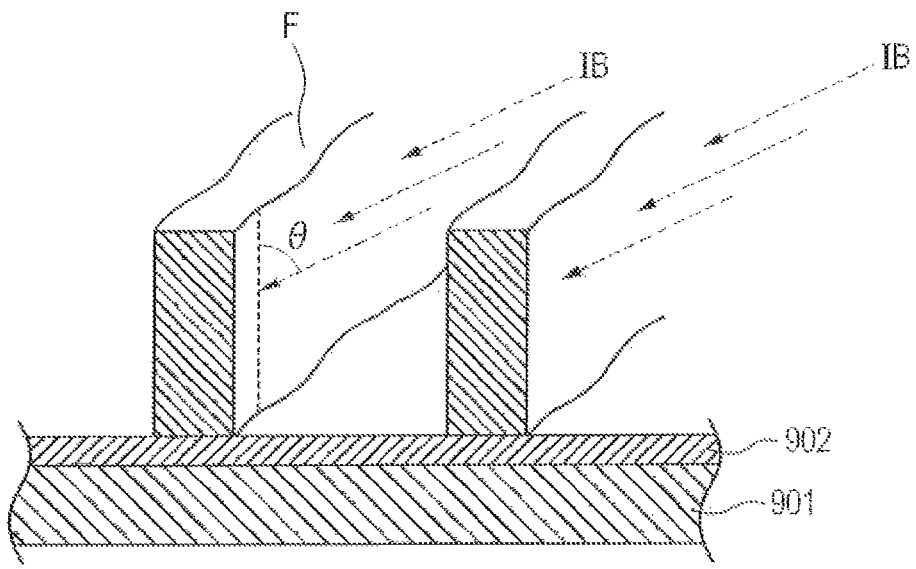
FIG. 5 is a view for explaining a first embodiment according to the present invention.

Next, referring to FIG. 5, a method of reducing the roughness of the side walls of the fins F using the IBE system 100 according to this embodiment will be described. FIG. 5 is an enlarged view of part of the substrate shown in FIG. 1. The side walls of the fins F formed on the insulating film 902 have LER, and undulate in-plane directions of the substrate.

In this embodiment, after the fins F are formed, an ion beam (hereinafter referred to as IB) is applied to the side walls of the fins F to reduce roughness.

At this time, the IB incident on the substrate 11 needs to have a certain inclination $\theta$ with respect to a direction normal to the plane of the substrate. This is because the LER represents side wall undulations in in-plane directions of the substrate; ridges principally extend in a direction normal to the plane of the substrate; and therefore, when the IB is made incident in a direction normal to the plane of the substrate, the IB cannot efficiently reduce the roughness of the side walls. Moreover, it is also desirable to efficiently apply the IB to the side walls in the following respect: during the application of the IB onto the side walls, the etching of upper portions of the fins F and bottom portions of the trenches 904 proceeds, and shape accuracy is deteriorated.

Figure 6A:
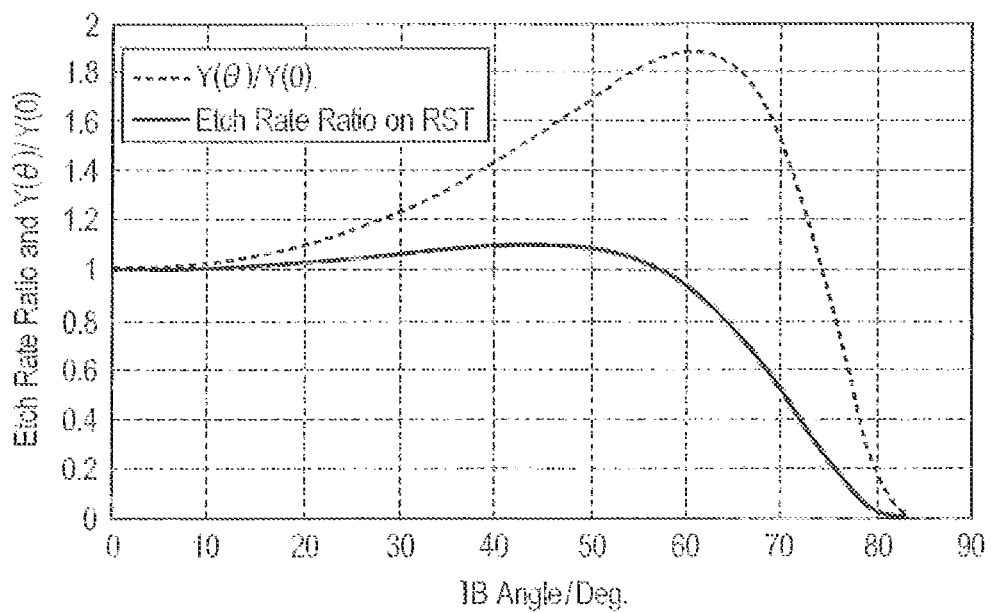
FIG. 6A is a view showing the relationship between the incident angle of the ion beam and each of sputtering yield and etch rate.

Here, FIG. 6A shows the relationship between the incident angle of the IB and sputtering yield. FIG. 6A shows calculated values for the case where Ar ions are incident on Si at an energy of 200 eV. In FIG. 6A, the horizontal axis represents the tilt angle of the IB with respect to the substrate. It should be noted that for the horizontal axis, 0 degrees means the case where the IB is incident in a direction normal to the plane of the substrate. A broken line represents the ratio of the sputtering yield for the case where the IB is incident at a predetermined angle $\theta$ and the sputtering yield for the case where the IB is incident at an angle of 0 degrees. A solid line represents one ratio of the etch rate for the case where the IB is incident at a predetermined angle $\theta$ and the etch rate for the case where the IB is incident at an angle of 0 degrees.

Figure 6B:
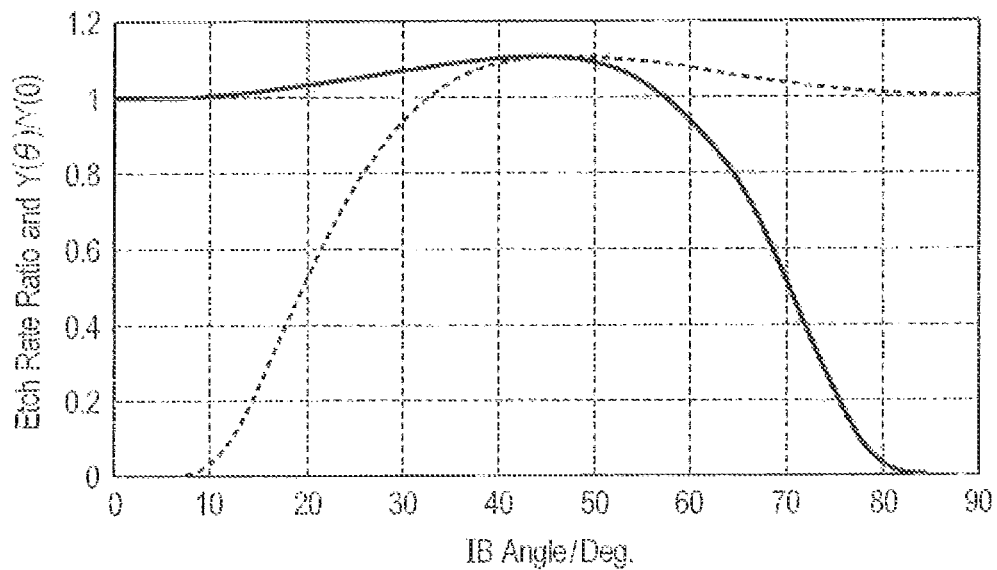
FIG. 6B is a view showing the relationship between the etch rate for a surface parallel to the substrate and the incident angle of the ion beam and the relationship between the etch rate for a surface perpendicular to the substrate and the incident angle of the ion beam.

FIG. 6B is a view for comparing the etch rate for a surface parallel to the substrate 11 (e.g., the bottom portions of the trenches 904) and the etch rate (e.g., the side walls FS) for a surface perpendicular to the substrate 11 when the tilt angle $\theta$ of the IB with respect to the substrate 11 is changed. A broken line represents the etch rate for a surface perpendicular to the substrate 11, and a solid line represents the etch rate for a surface parallel to the substrate 11. As can be seen from FIG. 6B, with increasing tilt angle $\theta$ of the IB with respect to the substrate 11, the etch rate for a surface parallel to the substrate 11 decreases, and the etch rate for a surface perpendicular to the substrate 11 rises instead. By making the IB incident on the substrate 11 at an angle $\theta \geq 45$ degrees at which the solid line and the broken line intersect, the side walls FS can be efficiently processed.

As described above, by applying the IB to the side walls of the fins F to reduce roughness after the semiconductor film 903 is processed to form the fins F, the roughness of the side walls of the fins F can be easily reduced. Moreover, variations in threshold voltages Vt of transistors caused by the roughness can be reduced to improve yield.

Second Embodiment

A second embodiment different from the first embodiment will be described. It should be noted that in the descriptions of the following other embodiments, some descriptions same as those in the first embodiment will be omitted.

Figure 7:
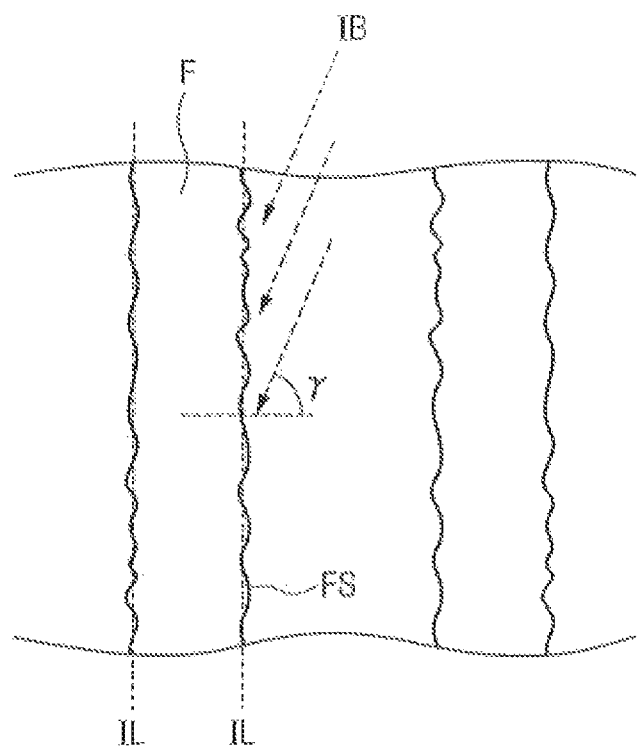
FIG. 7 is a view for explaining a second embodiment according to the present invention.

FIG. 7 shows the fins F shown in FIG. 1 as seen from above. In this drawing, broken lines IL are lines extending in in-plane directions of the substrate and in the extending direction of the fins F. Ideally the side walls of the fins F are desirably formed parallel to the broken lines IL. The side walls FS of the fins F have roughness such that the side walls FS undulate with respect to the broken lines.

In the first embodiment, to reduce such roughness of the side walls FS, only the incident angle $\theta$ of the IB with respect to a direction normal to the plane of the substrate has been studied. In addition so this, in this embodiment, the incident angle $\gamma$ of the IB with respect to a line normal to the broken lines IL in a plane parallel to the plane of the substrate is also considered. Thus, the IB processing of the side walls FS is more efficiently performed.

It should be noted that the incident angle $\gamma$ can be found as the angle between the projection of the IB, incident on the substrate, on a plane parallel to the substrate and lines normal to the broken lines IL extending in the extending direction of the fins F.

For the incident angle $\gamma$ similar to the above-described incident angle $\theta$, the relationships shown in FIGS. 6A and 6B also hold true. In this embodiment, using the relationships shown in FIGS. 6A and 6B and the relationship in which roughness exists along the broken lines IL, the roughness of the side walls FS is efficiently reduced. A state in which the side walls FS have roughness can be said to be a state in which the side walls FS include plural surfaces locally inclined with respect to the broken lines IL. In FIG. 6B, a surface parallel to the substrate 11 for the incident angle $\theta$ corresponds to a surface parallel to the broken lines IL for the incident angle $\gamma$, and a surface perpendicular to the substrate 11 for the incident angle $\theta$ corresponds to a surface perpendicular (or inclined) with respect to the broken lines IL for the incident angle $\gamma$. As shown in FIG. 6B, the incident angle $\gamma$ with respect to flat surfaces is preferably 45 degrees or more so that etch amounts for flat surfaces (i.e., surfaces parallel to the broken lines IL) may be small and that inclined surfaces (i.e., surfaces inclined with respect to the broken lines IL) may be more efficiently etched. This is because it can be seen from FIG. 6B that for $\gamma \geq 45$ degrees, the roughness (i.e., irregularities having heights in directions perpendicular to the side walls FS) of the side walls FS is selectively etched with respect to the side walls FS.

Moreover, in FIG. 6A, when the incident angle $\theta$ is read as the incident angle $\gamma$, the etch rate ratio and the sputtering ratio are highest for the IB incident at a predetermined incident angle $\gamma$ in the case where the incident angle $\gamma$ is around 60 degrees. In the case where the incident angle $\gamma$ is approximately 70 degrees or more, etch amounts by the incidence of the IB are small for flat surfaces which are includes in the side walls FS and parallel to the broken lines IL. However, for surfaces inclined with respect to the broken lines IL, the angle of the incident IB is smaller that 70 degrees, and therefore etch amounts are large. For example, when the incident angle γ of the IB with respect to a line normal to the broken lines IL is 70 degrees, the IB is incident at an angle of 60 degrees on a surface 10 degrees inclined from a broken line IL toward the direction of incidence of the IB. As a result, surfaces inclined with respect to the broken lines IL are preferentially etched, and become more planar with increasing IB quantity. Accordingly, it is more desirable to perform etching at a predetermined incident angle γ at which etch rates for surfaces inclined with respect to the broken lines IL are higher than etch rates for surfaces parallel to the broken lines IL. With this configuration, the etching of surfaces inclined with respect to the broken lines IL proceeds more rapidly. Accordingly, the side walls FS can be naturally brought close to a state in which the side walls FS are parallel to the broken lines IL. Further, by making the IB incident in one direction and then similarly making the IB incident in another direction at an incident angle γ, the side walls FS can be processed to be more planar.

As described above, by applying the IB to the side walls FS at a large incident angle γ, the roughness of the side walls FS can be efficiently reduced. Next, an IBE system capable of achieving such a process will be described.

An IBE system 100 according to this embodiment has the following feature: in a state in which the substrate 11 mounted on the substrate holder 10 is positioned to be tilted with respect to the grid 9, IBE is performed while the rotational speed of the substrate holder 10 is being changed, whereby the quantity of an IB incident on the side walls FS for incident angles γ≥75 degrees is increased.

Figure 8:
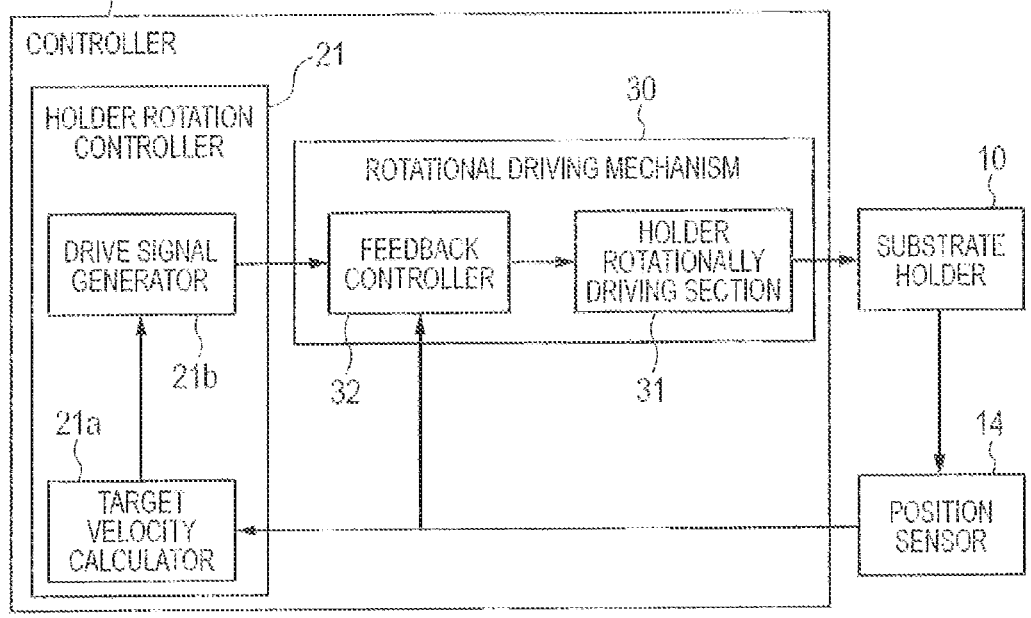
FIG. 8 is a view for explaining the second embodiment according to the present invention.

Referring to FIG. 8, a controller 20 will be described which is included in the IBE system 100 of this embodiment and which controls the rotational speed of the substrate holder 10 and components of other relating devices. FIG. 8 is a block diagram showing the controller in this embodiment.

As shown in FIG. 8, the controller 20 of this embodiment includes, for example, a general computer and various kinds of drivers. Specifically, the controller 20 includes a CPU (not shown) for executing various kinds of processing such as operations, controls, and determinations, and a ROM, an HDD (not shown), or the like for storing data such as various control programs to be executed by the CPU. Moreover, the controller 20 includes a RAM for temporarily storing data which is being processed by the CPU, input data, and the like, a nonvolatile memory (not shown) such as a flash memory or an SRAM, and the like. In this configuration, the controller 20 executes IBE in accordance with a command of a predetermined program stored on the above-described ROM or the like or a host device. In accordance with the command, various kinds of process conditions are controlled, such as discharge time, discharge powers, voltage applied to the grid, processing pressure, and the rotation and tilt of the substrate holder 10. Moreover, it is also possible to obtain output values of a pressure gauge (not shown) for measuring the pressure in the IBE system 100 and a sensor such as a position sensor 14 as position detection means for detecting the rotational position of the substrate, and control can also be performed according to the state of the system.

Moreover, the controller 20 includes a holder rotation controller 21 as rotation control means for controlling the rotational speed of the substrate 11 according to the rotational position detected by the position sensor 14. The holder rotation controller 21 includes a target velocity calculator 21a and a drive signal generator 21b, and has the function of controlling the rotation of a rotational portion of the substrate holder 10 according to the rotational position of the substrate 11 based on the positional relationship between the rotational position of the substrate 11 and the grid 9 and thus controlling the rotational speed of the substrate 11. The controller 20 is configured to receive information on the rotational position of the substrate 11 from the position sensor 14. Upon the controller 20 receiving the above-described information on the rotational position, the target velocity calculator 21a calculates, based on the value of the current rotational position of the substrate 11 outputted from the position sensor 14 for sensing the rotational position of the substrate 11, a target rotational speed at this position. This value of the target rotational speed can be computed by, for example, previously storing the correspondence between the rotational position of the substrate 11 and the target rotational speed as a map in advance. Based on the target rotational speed calculated by the target velocity calculator 21a, the drive signal generator 21b generates a drive signal for achieving the target rotational speed, and outputs the drive signal to the rotational driving mechanism 30. The controller 20 is configured to send the above-described drive signal generated by the drive signal generator 21b to the rotational driving mechanism 30.

It should be noted that in the example shown in FIG. 8, the rotational driving mechanism 30 includes a holder rotationally driving section 31 such as a motor for driving the substrate holder 10, and a feedback controller 32 for determining an operation value of the holder rotationally driving section 31 based on the deviation of an actual value (rotational position or rotational speed) outputted from the position sensor 14 from the target value; and drives the substrate holder 10 using a servomechanism. However, feedback control is not an indispensable constituent feature of the present invention, and the motor may be any of a DC motor and an AC motor. The rotational driving mechanism 30 drives the holder rotationally driving section 31 based on the drive signal received from the controller 20 to rotate the substrate holder 10.

Next, the control of the IBE system 100 of this embodiment shown in FIG. 3 and an IBE method carried out using this system will be described.

First, a substrate having fins F formed thereon such as shown in FIG. 1 is prepared. The substrate 11 is mounted on the substrate holder 10 in the processing space 1 through a substrate transfer opening 16 by unillustrated transfer means, e.g., a handling robot provided in an adjacent vacuum transfer chamber. Alternatively, the fins F may be formed using the IBE system 100 according to this embodiment.

A rotation start position of the mounted substrate 11 is detected using a notch or an orientation flat.

Alternatively, an alignment mark provided on the substrate 11 is read by an optical camera or the like to detect the rotation start position. The rotation start position may be detected before the substrate 11 is mounted on the substrate holder 10 or may be detected after the substrate 11 is mounted on the substrate holder 10. Based on a result of the detection of the rotation start position of the substrate 11, the rotational speed of the substrate 11 is controlled in accordance with the positional relationship between the grid 9 and the substrate 11 for subsequent IBE.

Then, discharge gas such as Ar is introduced through the gas inlet 5 into the plasma generating portion 2. As the discharge gas, inert gas such as He, Ne, Kr, or Xe may be used other than Ar.

Alternatively, to selectively etch the side walls FS with respect to the insulating film 902 as an underlying layer of the fins F, reactive gas may be used. For example, in the case where the fins F are made of Si and the insulating film 902 is made of $SiO_2$, the side walls FS can be selectively etched by adding oxygen gas or nitrogen gas to inert gas as the discharge gas.

It should be noted that to reduce the implantation of ions into the fins F by the IB, it is preferred to use atoms with as large an atomic radius as possible. Accordingly, it is preferred to use inert gas such as Kr or Xe as the inert gas.

After that, radio-frequency power is supplied from the discharge power supply 12 to produce a discharge in the plasma generating portion 2. Then, a voltage is applied to the grid 9 to extract ions from the plasma generating portion 2 and form an ion beam. The ion beam extracted by the grid 9 is neutralized by the neutralizer 13 to become electrically neutral. The neutralized ion beam is applied to the substrate 11 on the substrate holder 10 to perform IBE.

When the ESC electrode is operated with the substrate 11 mounted on the substrate holder 10, the substrate 11 fixed thereon by electrostatic attraction. The substrate 11 mounted on the substrate holder 10 is tilted by an angle suitable for processing the side walls FS of the fins F, e.g., tilted with respect to the grid 9 by 80 degrees. The tilt angle is set to a predetermined angle by considering the state of a pattern on the substrate, process gas, processing pressure, plasma density, and the like.

After the substrate holder 10 having the substrate 11 mounted thereon is tilted with respect to the grid 9, the substrate holder 10 starts rotating about an axis perpendicular to the plane of the substrate 11. The position sensor 14 detects the rotational position of the substrate 11. By controlling by the holder rotation controller 21 according to the detected rotational position, the rotational speed of the substrate 11 is controlled in accordance with the rotational position detected by the position sensor 14.

Figure 9:
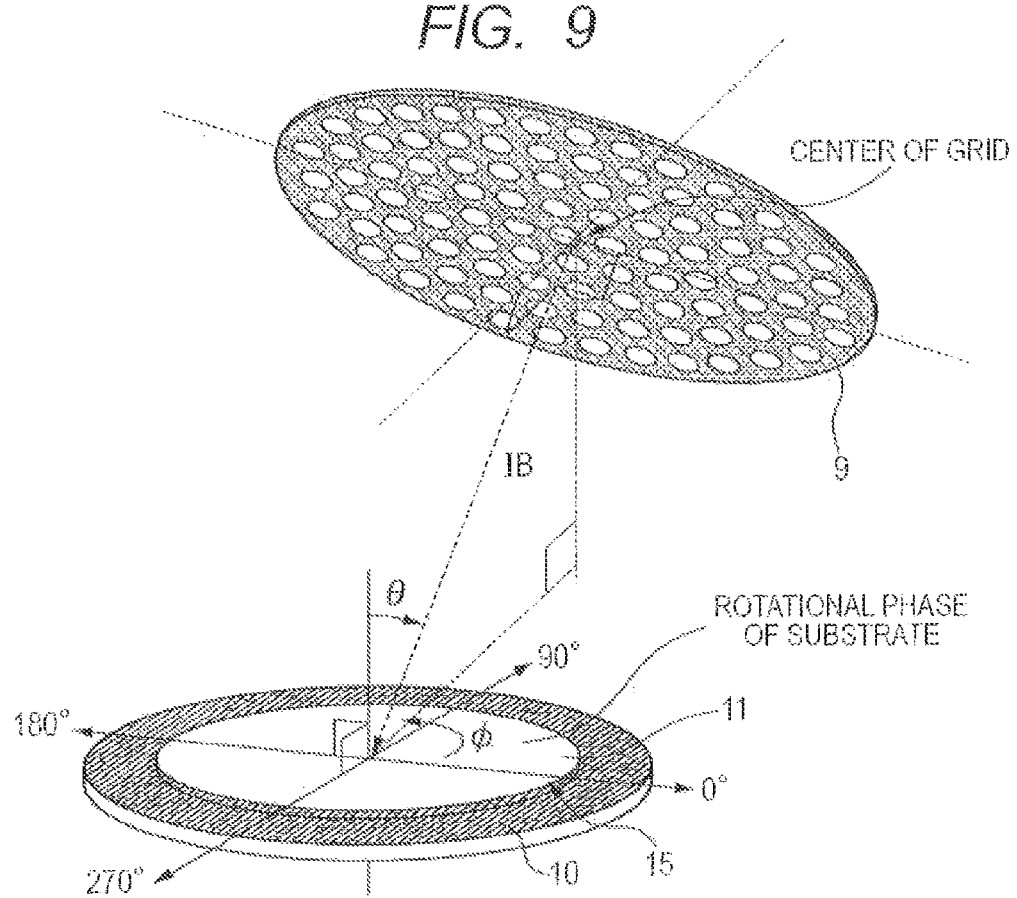
FIG. 9 is a view for explaining the second embodiment according to the present invention.

The control of the rotational speed of the substrate 11 will be described in more detail below. FIG. 9 is a view for explaining the positional relationship between the grid 9 and the substrate 11 according to this embodiment and the phase of the substrate 11.

Figure 10:
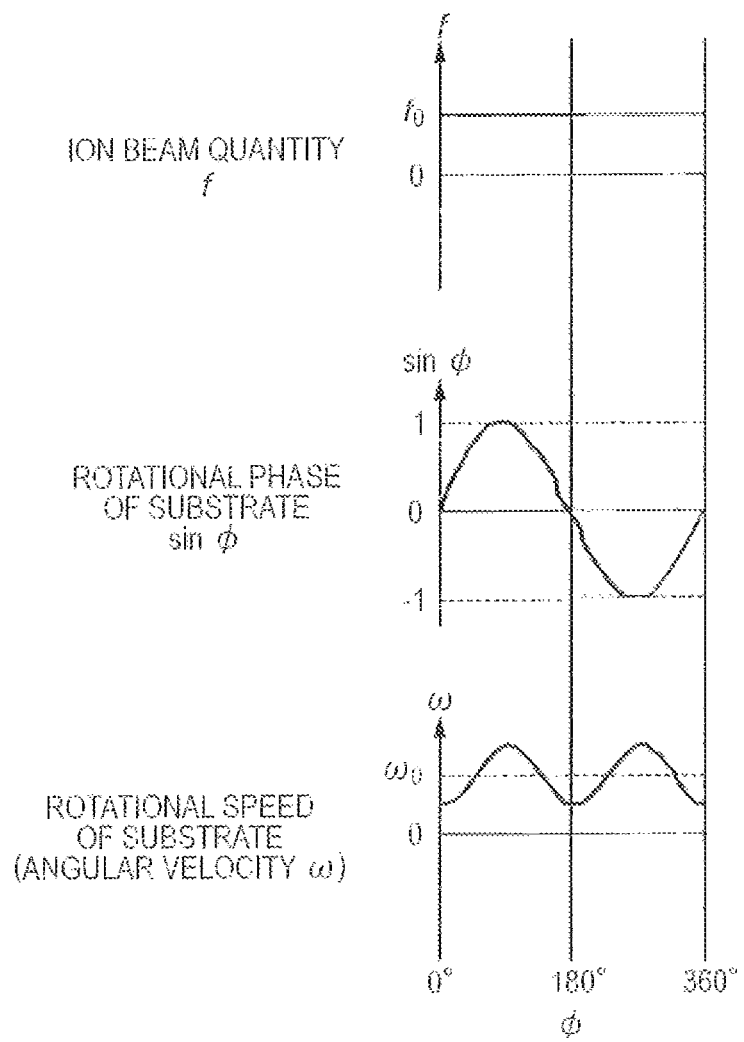
FIG. 10 is a view for explaining the second embodiment according to the present invention.

Moreover, FIG. 10 is an explanatory diagram showing a control map of substrate rotational speeds in the IBE method according to this embodiment.

Referring to FIGS. 9 and 10, the rotational position relationship between the grid 9 and the substrate 11 in this embodiment will be described. The substrate 11 is mounted on the rotatable substrate holder 10, and the substrate holder 10 is tilted with respect to the grid 9 during IBE. In the present invention, as shown in FIG. 9, with regard to the substrate rotational phase (rotation angle) $\Phi$, a notch 15 is regarded as a base point, and 0 degrees. Further, the position on the opposite side of the substrate 11 from the notch 15 is defined as 180 degrees. Moreover, 90 degrees and 270 degrees are defined from 0 degrees in a counterclockwise direction. Here, it is assumed that the fins F are formed to extend in a direction from 0 degrees to 180 degrees.

In one example of the IBE method using the system according to this embodiment, as shown in FIG. 10 and the following equation (1), the rotational speed is controlled so that the substrate rotational speed $\omega$ may be a sine wave with respect to the substrate rotational phase $\Phi$.

$$\omega = A \sin(2(\Phi - \alpha)) + B \quad (1)$$

$$A = a \cdot B \quad (2)$$

Specifically, based on the above equation (1), the holder rotation controller 21 as the rotation control means of the present invention calculates the rotational speed as a sine function with a period twice that of the rotation angle $\Phi$ of the substrate 11. Here, A represents the amplitude of the rotational speed, and is reference speed B multiplied by change factor a as shown in equation (2). The change factor a is selected so that $\omega > 0$ may be satisfied in the range of variation of $\Phi$. Further, $\alpha$ represents phase difference. By changing the change factor a and the phase difference $\alpha$, the distributions of etch amounts and taper angle in the substrate plane can be optimized for each ion beam incident angle. It should be noted that the range of the substrate rotational phase $\Phi$ is 0 degrees$\leq \Phi <$360 degrees.

A reason for calculating the rotational speed as a sine function with a period twice that of the rotation angle $\Phi$ of the substrate 11 is that in the case of the fin F shown in FIGS. 1 and 2, the IB is made incident on the side walls FS from the direction of each of a source region and a drain region separated by a gate to evenly process the entire surfaces of the side walls FS. In the case where the side walls FS can be evenly processed by the IB incident only from the side of any one of the source region and the drain region, the rotational speed may be calculated as a sine function with a period equal to that of the rotation angle $\Phi$.

In the example shown in FIG. 10, the substrate rotational speed $\omega$ is shown with respect to the substrate rotational phase $\Phi$, where the reference speed B is set to $\Phi_0$, the change factor a is a desired value not less than 0, and the phase difference $\alpha$ is 90 degrees. This means that, in this case, the number (rotational speed) of revolutions of the substrate is smallest when the notch 15 of the substrate 11 is at the positions of 0 degrees and 180 degrees.

Here, specific functions and effects of changing the rotational speed using the rotational phase will be described with reference to FIG. 7.

In the above explanation of FIG. 7, it has been explained that when the inclination $\gamma$ with respect to a line normal to the broken lines IL is large, the side walls FS can be efficiently planarized. According to this embodiment, in the case where the grid 9 is positioned in the extending direction of the fins F (extending direction of the broken lines IL) (i.e., the case where the IB is incident in the extending direction of the fins F), the rotational speed of the substrate holder 10 is lowest. On the other hand, in the case where the grid 9 is positioned in a direction perpendicular to the extending direction of the broken lines IL, the rotational speed of the substrate holder 10 is highest.

Accordingly, it becomes possible to reduce the incidence of the IB which has a small tilt angle $\gamma$ and which does not largely contribute to the planarization of the side walls FS is reduced, and, on the other hand, increase the incidence of the IB which has a large tilt angle $\gamma$ and which largely contributes to the planarization of the side walls FS. As a result, unnecessary etching of the side walls FS is inhibited, and the side walls FS can be processed with higher size accuracy and higher shape accuracy.

Moreover, by making the rotational speed of the substrate holder 10 lowest when the rotational phase of the substrate 11 is 0 degrees and 180 degrees, the side walls FS are evenly processed by the IB incident in each of the 0-degree direction and the 180-degree direction.

In this embodiment, the control map shown in FIG. 10 may be previously stored on a memory such as a ROM provided in the controller 20. By previously storing the above-described control map on a memory in this way, upon the receipt of information on the rotational position of the substrate 11 from the position sensor 14, the target velocity calculator 21a refers to the control map shown in FIG. 10 which is stored on the above-described memory. Then, the target velocity calculator 21a extracts the rotational speed corresponding to the current rotation angle $\Phi$ of the substrate 11, obtains the target rotational speed, and outputs the obtained target rotational speed to the drive signal generator 21b.

Figure 11:
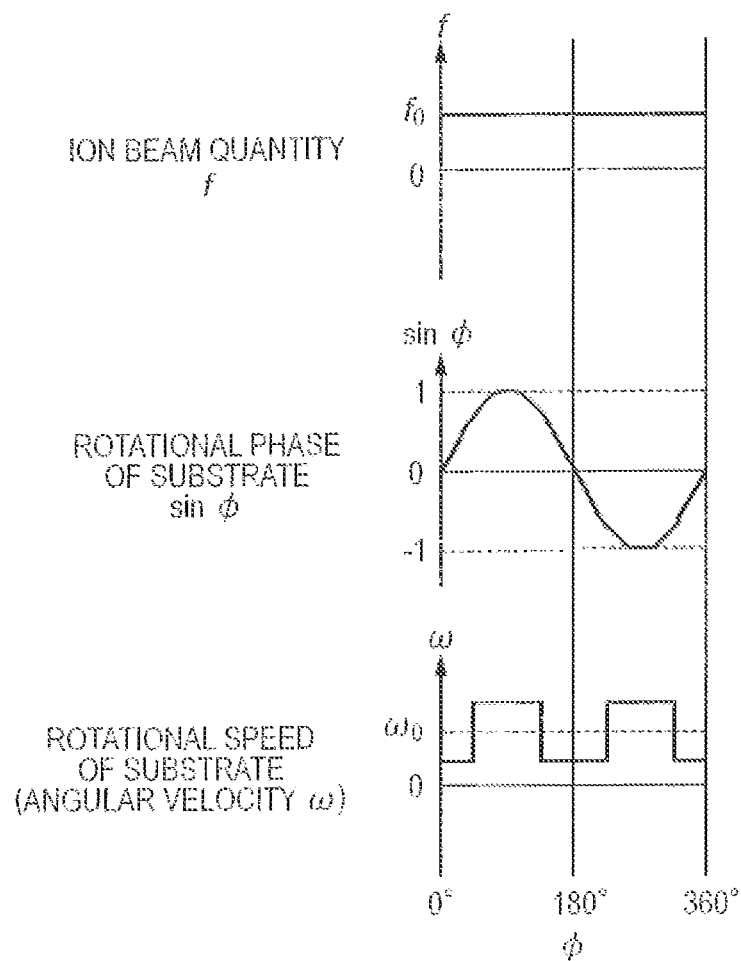
FIG. 11 is a view for explaining the second embodiment according to the present invention.

The variation of the rotational speed of the substrate holder 10 does not have to be continuous variation such as the sine function shown in FIG. 10. For example, as shown in FIG. 11, the following rotational speed variation using two values may also be employed: the substrate rotational speed is set to a first speed in ranges in which the rotation angle Φ of the substrate 11 is 0 degrees to 45 degrees, 135 degrees to 225 degrees, and 315 degrees to 360 degrees, and the substrate rotational speed is set to second speed higher than the first speed in ranges of 45 degrees to 135 degrees and 225 degrees to 315 degrees. Moreover, to make incident on the side walls FS only the IB which more largely contributes to the planarization of the side walls, the following rotational speed variation using two values may also be employed: the substrate rotational speed is set to a first speed in ranges in which the rotation angle Φ is 0 degrees to 30 degrees, 150 degrees to 210 degrees, and 330 degrees to 360 degrees; and the substrate rotational speed is set to a second speed higher than the first speed in ranges of 30 degrees to 150 degrees and 210 degrees to 330 degrees.

Alternatively, the rotational speed may be varied in stages so these the rotational speed of the substrate 11 may be lowest when the rotation angle Φ is 0 degrees and 180 degrees, and that the rotational speed of the substrate 11 may be highest when Φ is 90 degrees and 270 degrees.

Moreover, by actively making the IB coming in the extending direction of the fins F incident on the substrate in this way, even in the case where spacings between the fins F are narrow, the influence of shadows of adjacent fins can be reduced, and the IB can be applied to the entire surfaces of the side walls FS.

When the side walls FS of the fins F are processed using the IB, it is desirable that the processing of the side walls FS is started after the IB is stably extracted from the grid 9 and the rotation of the substrate 11 is stabilized. Accordingly, the following may be employed: before the processing of the substrate 11 is started, the IB is prevented from impinging on the substrate 11 using an unillustrated shield plate or the like; and, after the rotation of the substrate 11 and the IB are stabilized, the processing is started by clearing the shield plate.

Third Embodiment

In the second embodiment, the rotational speed of the substrate holder 10 is controlled so that the quantity of the IB incident in the extending direction of the fins F may be larger than the quantity of the IB incident in the other directions. Moreover, the rotation of the substrate holder 10 is continuous rotation. On the other hand, in this embodiment, the rotation mode of the substrate holder 10 is non-continuous pulsed rotation.

Figure 12:
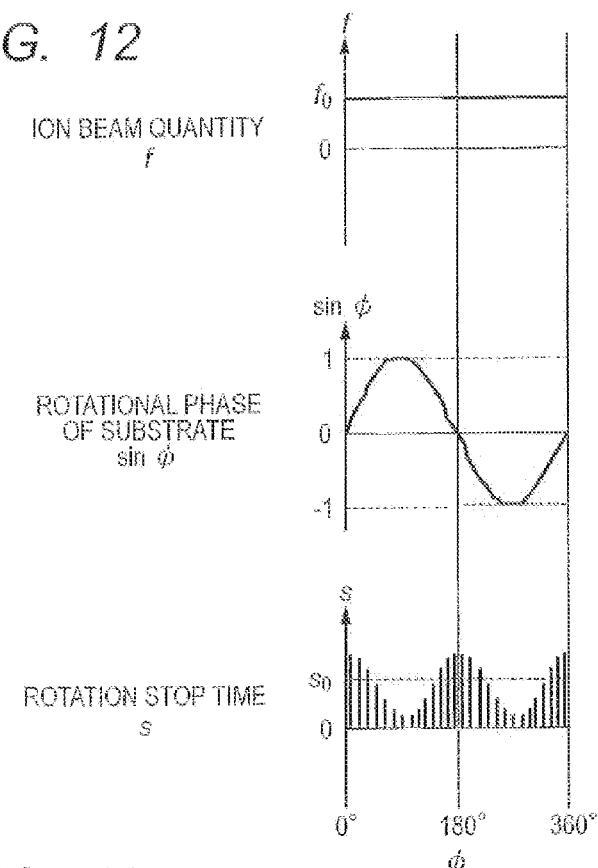
FIG. 12 is a view for explaining a third embodiment according to the present invention.

FIG. 12 is an explanatory diagram according to this embodiment for the case where the substrate holder 10 is non-continuously rotated and where rotation stop time for the rotation of the substrate is controlled.

In the case where the rotation of the substrate 11 (substrate holder 10) is non-continuously (in the form of clock pulses) performed, the holder rotation controller 21 controls the rotation stop time s as shown in FIG. 12. Specifically, the holder rotation controller 21 controls the rotation of the substrate holder 10 such that, for example, the rotation of the substrate 11 stops at plural predetermined rotation angles and that the rotational portion of the substrate holder 10 rotates at a certain angular velocity (rotational speed) at other rotation angles. By such control, the rotational speed of the substrate 11 is controlled so that the substrate 11 may non-continuously rotate. It should be noted that the rotational speed of the rotational portion of the substrate holder 10 may be constant as described above or may be varied. Here, the "rotation stop time s" refers to the time during which the angular velocity is 0, where the vertical axis is the rotational speed (angular velocity ω), and the horizontal axis is time t. In other words, the rotation stop time s is the time during which the rotation of the substrate holder 10 is stopped, in the case where the substrate holder 10 is non-continuously rotated. Here, $s_0$ is reference rotation stop time.

In this embodiment, as in the second embodiment, essential features are that the substrate mounted on the substrate holder is positioned to be tilted with respect to the grid 9 and that the quantify of the IB incident in the extending direction of the fins F is made larger than the quantity of the IB incident in any other direction. Specifically, by giving the substrate a long rotation stop time when the grid 9 is positioned in the extending direction of the fins F, effects similar to those of the second embodiment can be obtained.

In this embodiment, the rotation stop time is sinusoidally oscillated at a frequency of two cycles per revolution of the substrate 11 (substrate holder 10) so that the rotation stop time may be long for the extending direction of the fins F (the rotational position of the substrate 11 may be 0 degrees and 180 degrees).

To make shape evenness favorable, the rotation stop time is favorably equal at symmetric rotational positions (e.g., 0 degrees and 180 degrees) about the substrate 11.

Fourth Embodiment

In the second embodiment, an aspect has been described in which the rotational speed of the substrate holder 10 is controlled. In this embodiment, by controlling the electric power supplied from the power supply 12 to the RF antenna 6, the quantity of the IB incident on the substrate is controlled, and the trimming of the side walls FS of the fins F is efficiently performed.

In IBE, the quantity of the IB (i.e., the density of ions in the IB) incident on the substrate 11 relates to the plasma density of a plasma produced in the plasma generating portion 2. Accordingly, the plasma density in the plasma generating portion 2 can be changed by changing the electric power supplied to the RF antenna 6. Thus, the quantity (amount of energy) of the IB incident on the substrate 11 can be changed in accordance with the angular phase of the substrate 11.

In this embodiment, as in the second embodiment, essential features are that the substrate 11 mounted on the substrate holder 10 is positioned so face the grid 9 with a tilt and that in the IBE process, the quantity of the IB incident on the substrate 11 in the extending direction of the fins F is larger than the quantity of the IB incident on the substrate 11 in any other direction.

Figure 13:
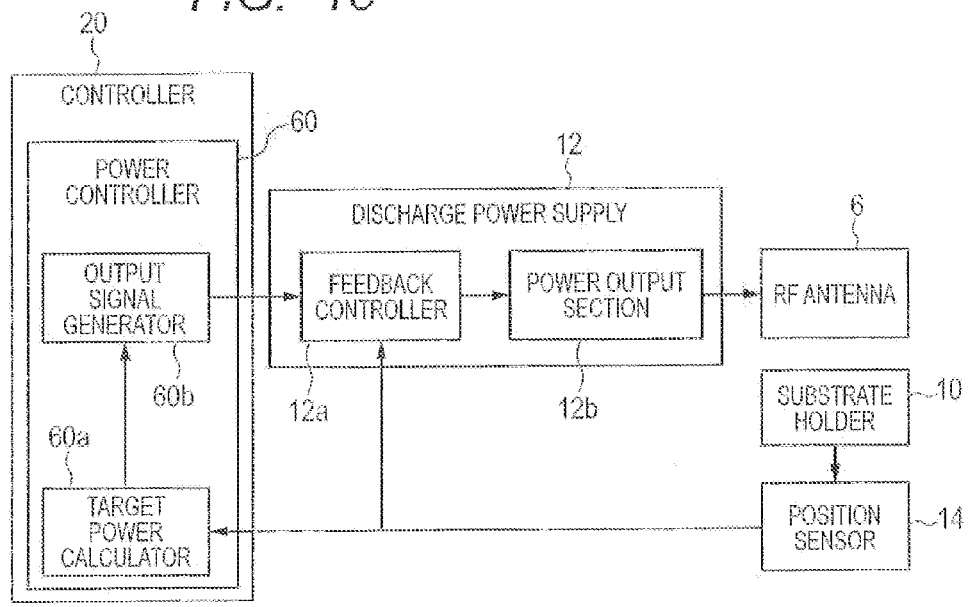
FIG. 13 is a view for explaining a fourth embodiment according to the present invention.

FIG. 13 is a block diagram of the controller 20 according to this embodiment. In this embodiment, the controller 20 includes a power controller 60 as power control means for controlling power (electric power) supplied to the plasma generation means in accordance with the rotational position detected by the position sensor 14. The power controller 60 includes a target power calculator 60a and an output signal generator 60b, and has the function of controlling the power (electric power) to the plasma generation means based on the positional relationship between the rotational position of the substrate 11 and the grid 9.

The controller 20 is configured to receive information on the rotational position of the substrate holder 10 from the position sensor 14. Upon the controller 20 receiving the above-described information on the rotational position, the target power calculator 60a calculates, based on the value of the current rotational position of the substrate holder 10 inputted from the position sensor 14 for sensing the rotational position of the substrate holder 10, the target power (target electric power) at this position. This target power value can be computed by, for example, previously storing the correspondence between the rotational position of the substrate holder 10 and the target power as a map on a memory or the like provided in the controller 20. Based on the target power calculated by the target power calculator 60a, the output signal generator 60b generates an output signal for achieving the target power, and outputs the output signal to the power supply 12. The controller 20 is configured to send the above-described output signal generated by the output signal generator 60b to the power supply 12.

It should be noted that in the example shown in FIG. 13, the power supply 12 includes a power output section 12b for supplying electric power to the RF antenna 6 as plasma generation means, and a feedback controller 12a for determining an operation value of the power output section 12b based on the deviation of an actual value (rotational position or rotational speed) outputted from the position sensor 14 from the target value. However, feedback control is not an indispensable constituent feature of the present invention.

In this embodiment, the rotation mode of the substrate holder may be continuous rotation as in the second embodiment, or may be non-continuous pulsed rotation.

Figure 14B:
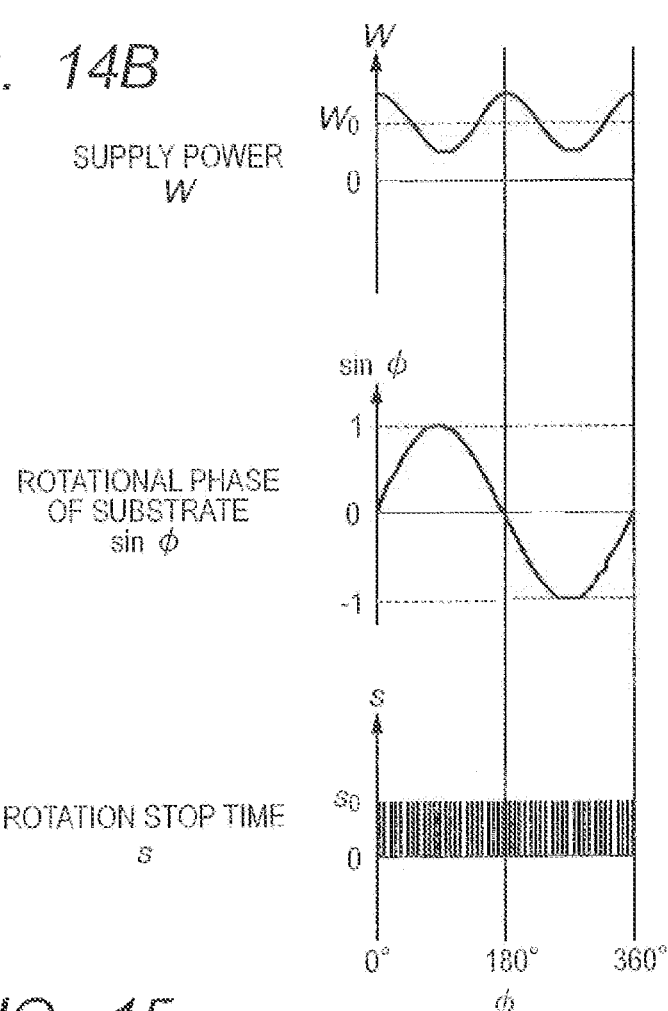
FIG. 14B is a view for explaining the fourth embodiment according to the present invention.

FIG. 14A is an explanatory diagram according to this embodiment for the case where the substrate (substrate holder) is continuously rotated and where the power supplied to the RF antenna 6 (plasma generation means) is controlled. FIG. 14B is an explanatory diagram according to this embodiment for the case where the power supplied to the RF antenna 6 (plasma generation means) is controlled and where the substrate (substrate holder) is non-continuously rotated. In the case where the substrate is non-continuously rotated, the rotation stop time may be varied with the power supplied to the RF antenna 6 (plasma generation means) maintained constant to control the IB quantity in accordance with the rotation angle $\Phi$.

In the embodiment according to FIG. 14A, using a sine function with a double period such as shown in equation (1), the power controller 60 can calculate discharge power in accordance with the rotation angle $\Phi$ of the substrate 11.

Specifically, the power controller 60 generates an output signal so that the supply power for the RF antenna 6 (plasma generation means) may be oscillated at a frequency of two cycles per resolution of the substrate 11 (substrate holder 10). Here, the power supplied to the RF antenna 6 (plasma generation means) may be smoothly and continuously varied, or may be varied in steps having widths. As shown in FIGS. 14A and 14B, the power controller 60 may control the power supply 12 so that at rotation angles $\Phi$ of 0 degrees and 180 degrees at which the grid 9 is positioned in the extending direction of the grooves of the pattern, the supplied power (electric power) may be maximized to maximize the quantity of the IB incident on the substrate 11; and that at other rotation angles, the power may be made small to reduce the quantity of the IB incident on the substrate 11.

As described above, in this embodiment, effects of the present invention can be obtained by positioning the substrate mounted on the substrate holder with a tilt with respect to the grid 9 and controlling the power supplied to the RF antenna 6 so that the quantity (amount of energy) of the IB incident in the extending direction of the fins F may be large. Moreover, to make shape evenness favorable, the applied voltage is favorably equal at symmetric rotational positions (e.g., 0 degrees and 180 degrees) about the substrate 11.

Fifth Embodiment

In the fourth embodiment, a method has been described in which the side walls FS of the fins F are efficiently processed by controlling the power supplied to the RF antenna 6 as plasma generation means. In this embodiment, by varying the beam extraction voltage, the side walls FS are efficiently processed. In IBE, after a plasma is produced in the plasma generating portion 2, ions in the plasma generating portion 2 are extracted by the voltage applied to the grid 9 to form a beam. Here, since the energy of the IB extracted from the plasma generating portion 2 depends on the beam extraction voltage, the side walls FS are efficiently processed by varying this voltage in accordance with the rotational phase of the substrate.

Referring to FIG. 4, the beam extraction voltage in this embodiment will be described below.

Generally, the substrate holder 10 and the third electrode 72 are at the ground potential. Accordingly, the energy of each of ions in the IB is determined by the positive voltage applied to the first electrode 70. Thus, in this embodiment, the voltage applied to the first electrode is the beam extraction voltage. An embodiment will be described below in which the beam extraction voltage is varied by varying this voltage applied to the first electrode 70.

In this embodiment, as in the other embodiments, an essential feature is that by varying the beam extraction voltage in the IBE process, the quantity (amount of energy) of the IB incident on the substrate in the extending direction, of the fins F is made larger than the quantity (amount of energy) of the IB incident on the substrate in any other direction.

Figure 15:
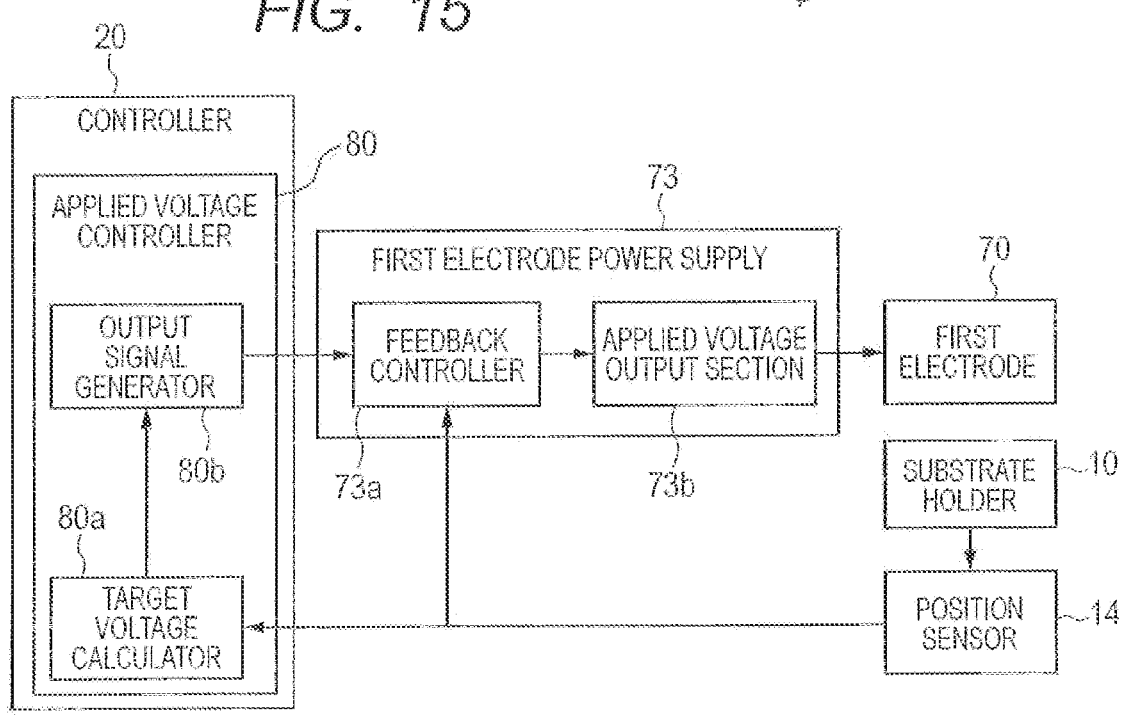
FIG. 15 is a view for explaining a fifth embodiment according to the present invention.

FIG. 15 is a block diagram of the controller 20 according to this embodiment. In this embodiment, the controller 20 includes an applied voltage controller 80 as voltage control means for controlling the voltage (beam extraction voltage) applied to the first electrode 70 in accordance with the rotational position detected by the position sensor 14.

The applied voltage controller 80 includes a target voltage calculator 80a and an output signal generator 80b, and has the function of controlling the voltage applied to the first electrode 70 based on the positional relationship between the rotational phase of the substrate 11 and the grid 9.

The controller 20 is configured to receive information on the rotational position of the substrate holder 10 from the position sensor 14. Upon the controller 20 receiving the above-described information on the rotational position, the target voltage calculator 80a calculates, based on the value of the current rotational phase of the substrate holder 10 inputted from the position sensor 14 for sensing the rotational phase of the substrate holder 10, the target voltage at this position. This target voltage value can be computed by, for example, previously storing the correspondence between the rotational position of the substrate holder 10 and the target voltage as a map on a memory or the like provided in the controller 20. Based on the target power calculated by the target voltage calculator 80a, the output signal generator 80b generates an output signal for achieving the target voltage, and outputs the output signal to a first electrode power supply 73. The controller 20 is configured to send the above-described output signal generated by the output signal generator 80b ho the first electrode power supply 73.

It should be noted that in the example shown in FIG. 15, the first electrode power supply 73 includes an applied voltage output section 73b for applying a voltage to the first electrode 70, and a feedback controller 73a for determining an operation value of the applied voltage output section 73b based on the deviation of an actual value (rotational position or rotational speed) outputted from the position sensor 14 from the target value. However, feedback control is not an indispensable constituent feature of the present invention.

In this embodiment, the rotation mode of the substrate holder may be continuous rotation as in the first embodiment, or may be non-continuous pulsed rotation as in the second embodiment.

Figure 16A:
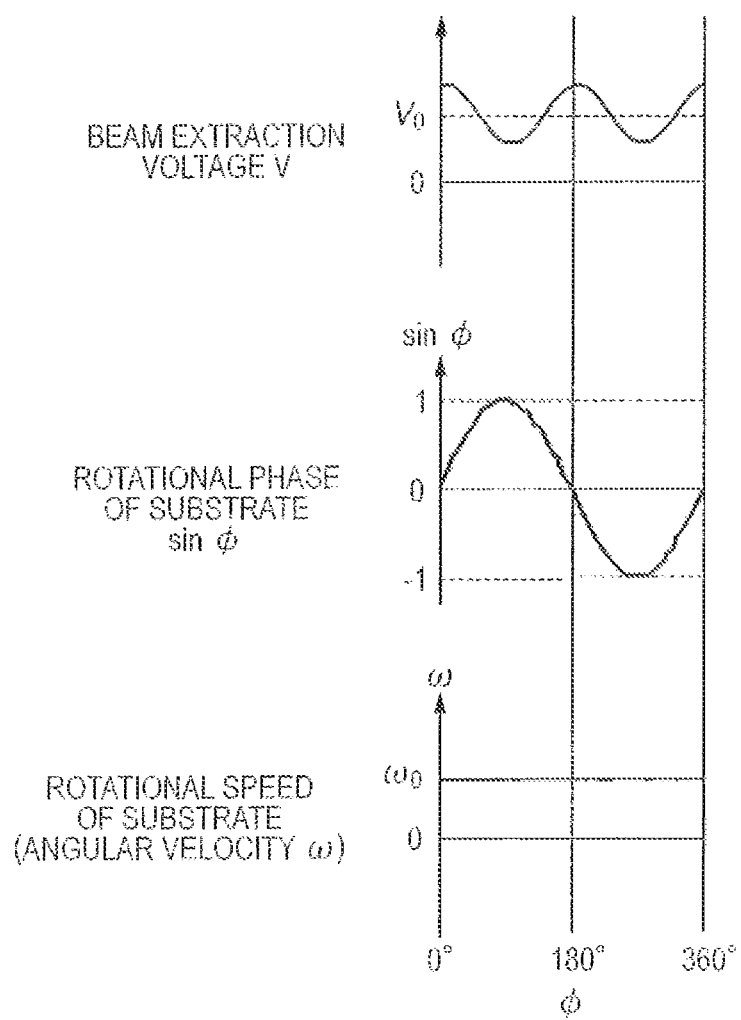
FIG. 16A is a view for explaining the fifth embodiment according to the present invention.
Figure 16B:
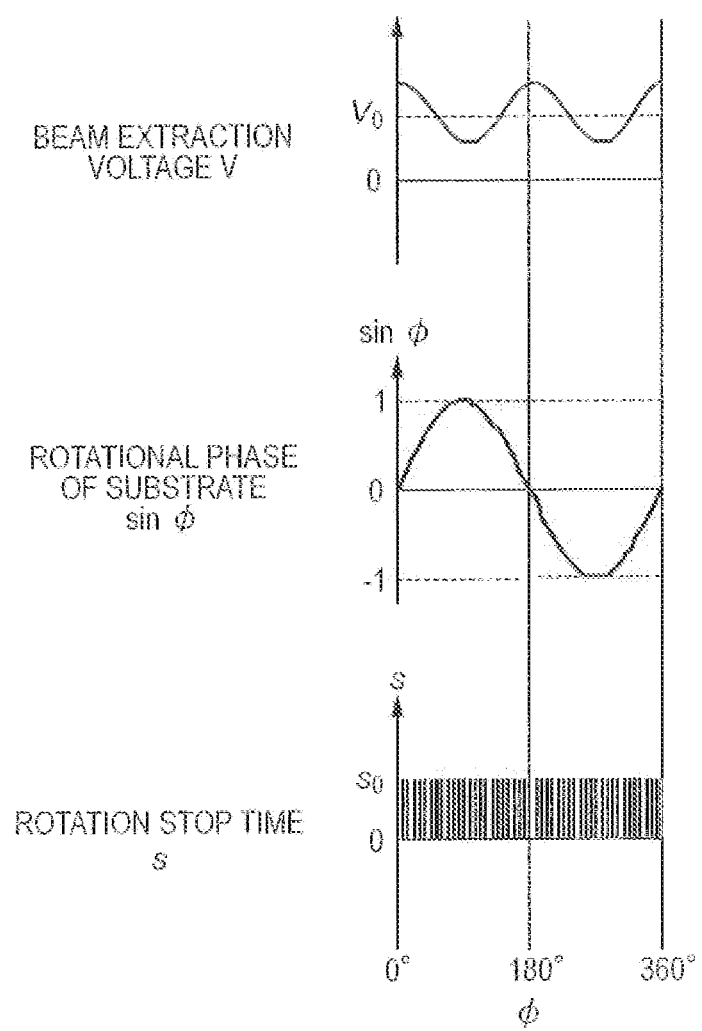
FIG. 16B is a view for explaining the fifth embodiment according to the present invention.

FIG. 16A is an explanatory diagram according to this embodiment for the case where the beam extraction voltage (i.e., the voltage applied to the first electrode 70) is controlled and where the substrate (substrate holder) is continuously rotated. FIG. 16B is an explanatory diagram according to this embodiment for the case where the beam extraction voltage is controlled and where the substrate (substrate holder) is non-continuously rotated. In the case where the substrate is non-continuously rotated, the rotation stop time may be varied with the beam extraction voltage maintained constant to control the IB quantity in accordance with the rotation angle Φ.

In the example according to FIG. 16A, using a sine function with a double period such as shown in equation (1), sire applied voltage controller 80 can calculate the applied voltage in accordance with the rotation angle Φ of the substrate 11. Specifically, the applied voltage controller 80 generates an output signal so that the beam extraction voltage may be oscillated at a frequency of two cycles per revolution (period) of the substrate 11 (substrate holder 10). Here, beam extraction voltage may be smoothly and continuously varied, or may be varied in steps having widths. For example, as shown in FIG. 16B, when the substrate 11 is in a primary state, i.e., at rotation angles Φ of 0 degrees and 180 degrees, the applied voltage controller 80 maximizes the voltage applied to the first electrode 70 to maximize the energy of the IB. On the other hand, when the grid 9 is positioned in a direction other than the extending direction of the fins F, the voltage is reduced to reduce the energy of the IB. To reduce the energy of the IB, the beam extraction voltage (voltage applied to the grid 9) may be reduced to zero to stop the application of the ion beam to the substrate 11.

As described above, in this embodiment, effects of the present invention can be obtained by positioning the substrate mounted on the substrate holder with a tilt with respect to the grid 9 and controlling the voltage supplied from the first electrode power supply 73 to the first electrode 70 using the applied voltage controller 80 so that the energy of the IB Incident in the extending direction of the fins F may be large. Moreover, to make shape evenness favorable, the supply power is favorably equal at symmetric rotational positions (e.g., 0 degrees and 180 degrees) about the substrate 11.

In this embodiment, the beam extraction voltage is varied by varying the voltage applied to the first electrode 70. However, the beam extraction voltage may be varied by other method. For example, the beam extraction voltage may be varied by varying the voltage applied to the third electrode 72 with the third electrode 72 subject to a lower positive voltage than the first electrode 70. Moreover, the voltage applied to the substrate holder 10 may be varied to vary the energy of the IB when impinging on the substrate 11.

Moreover, in this embodiment, the grid 9 does not necessarily need to include three electrodes. This is because the essence of this embodiment is that the energy of the IB is varied in accordance with the rotational phase of the substrate 11, as described previously.

Sixth Embodiment

In this embodiment, the tilt angle of the substrate 11 with, respect to the grid 9 is varied according to the rotational speed of the substrate 11 as in the first embodiment. This embodiment is effective particularly in the case where spacings between the fins F are narrow and where it is difficult to apply the IB to the entire surfaces of the side walls FS due to the influence of shadows of adjacent fins. Details of this embodiment will be described below with reference to FIG. 17.

Figure 17:
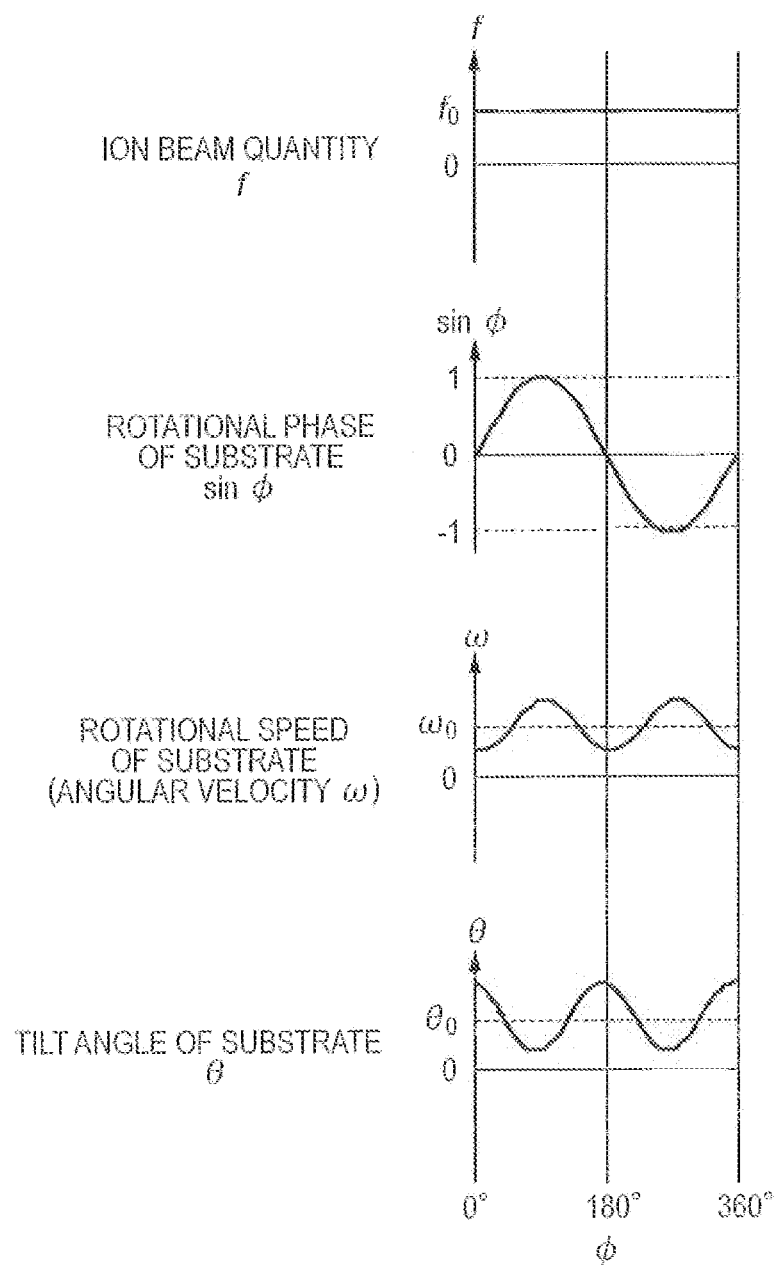
FIG. 17 is a view for explaining a sixth embodiment according to the present invention.

FIG. 17 shows the rotational speed of the substrate 11 varying in accordance with the rotational position thereof. Also, the tilt angle θ of the substrate 11 with respect to the grid 9 varies between 20 degrees and 80 degrees from 50 degrees set as a base. The tilt angle θ is preferably largest when the rotational speed of the substrate 11 is lowest, and smallest when the rotational speed of the substrate 11 is highest. Such control allows the following: when the IB is incident along the fins F of the substrate 11, the side walls FS of the fins F are efficiently processed; and, on the other hand, in a state in which the IB is less likely to impinge, by making the IB incident at an angle close to 90 degrees, the side walls FS can be processed while the influence of shadows of adjacent fins is reduced.

Seventh Embodiment

In the above-described embodiments, cases where the quantity (amount of energy) of the IB incident on the substrate 11 varies in the form of a sine function with respect to the substrate phase have been mainly described. On the other hand, in this embodiment, the rotation of the substrate is stooped only in a state in which the grid 9 is positioned in the extending direction of the fins F.

Figure 18:
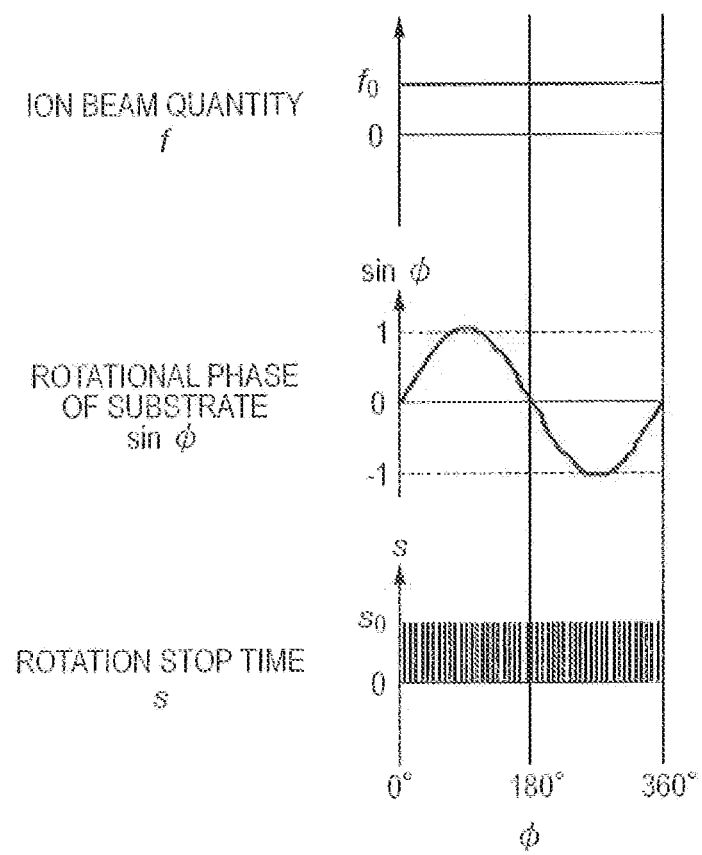
FIG. 18 is a view for explaining a seventh embodiment according to the present invention.

FIG. 18 shows the rotation stop time of the substrate 11 which varies in accordance with the rotational position. The rotation of the substrate is stopped only when the grid 9 is positioned in the directions of 0 degrees and 180 degrees, which correspond to the extending direction of the fins F. After the IB is applied for a certain period of time, rotation is performed again. The side walls FS of one actual fins F have certain inclinations with respect to the substrate, and the IB incident on the substrate has divergence. Accordingly, in the case where this embodiment is carried out, the ion beam is also applied to the side walls FS.

In addition to stopping the rotation of the substrate 11 only when the grid 9 is positioned in the extending direction of the fins F, varying the ion beam quantity or varying the ion beam voltage as in the fourth and fifth embodiments may also be employed. In this case, the amount of energy of the ion beam incident on the substrate 11 is increased only when the grid 9 is positioned in the extending direction of the fins F, and the amount of energy of the ion beam is reduced in other cases.

Eighth Embodiment

Figure 19:
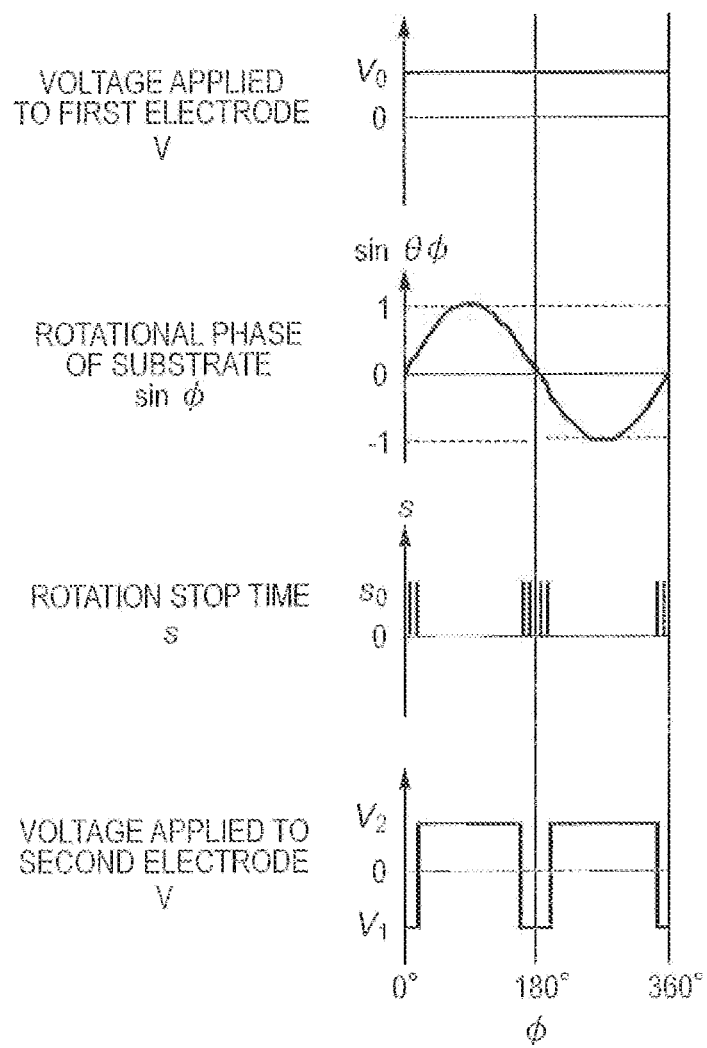
FIG. 19 is a view for explaining an eighth embodiment according to the present invention.

Referring to FIG. 19, the intention according to this embodiment will be described. FIG. 19 shows the rotation stop time of the substrate 11 varying in accordance with the rotational position, and further shows the voltage applied to the second electrode of the grid 9 also varying. In the seventh embodiment, only when the grid 9 is not positioned in the extending direction of the fins F, the rotation of the substrate 11 as stopped, and the ion beam is applied to the substrate 11. In addition to this, this embodiment has the following feature: when the grid 9 is positioned in the extending direct ion of the fins F, the incidence of the ion beam on the substrate 11 is inhibited.

In this embodiment, the voltage at the second electrode 71 of the grid 9 is controlled to control the quantity of the IB incident on the substrate 11. Positive ions produced in the plasma generating portion 2 are accelerated by a potential difference formed between the first electrode 70 and the second electrode 71 to be directed toward the substrate. In the case where the voltage at the first electrode 70 is lower than the voltage at the second electrode 71, since the positive ions are subject to forces in the direction from the second electrode 71 to the first electrode 70, the passage of the positive ions through the grid 9 is limited.

In this embodiment, utilizing this effect, when the grid 9 is positioned in the extending direction of the fins F, the voltage at the second electrode 71 is made lower than the voltage at the first electrode 70 to accelerate ions toward the substrate 11; and, when the grid 9 is not positioned in the extending direction of the fins F, the voltage at the second electrode 71 is made higher than the voltage at the first electrode 70 to confine ions within the plasma generating portion 2.

According to this embodiment, since the ion beam which is less likely to impinge on a reattached film formed on side walls of a TMR element is not applied to the substrate 11, deteriorations in accuracies of shape and size of element in the IBE process can be reduced.

It should be noted that in the fourth embodiment, the amount of energy of the IB incident on the substrate 11 can be checked by measuring the current flowing through the first electrode 70. Part of a plasma produced in the plasma generating portion 2 flows in the first electrode 70 to cause a current to flow through the first electrode 70. Since the current flowing through the first electrode 70 is proportional to the quantify of the plasma produced in the plasma generating portion 2, the amount of energy of the IB incident on the substrate can be measured by checking the current flowing through the first electrode 70.

In any of the embodiments, the amount of energy of the IB in the IBE process can be measured by calculating the electric power $W=V \cdot I \cdot T$, which is the product of the time T during which the ion beam is being applied to the substrate 11, the voltage V applied to the first electrode 70, and the current I flowing through the first electrode 70.

Moreover, the amount of energy of the IB incident on the substrate 11 in the extending direction of the fins F and the amount of energy of the IB incident on the substrate 11 in a direction other than the extending direction of the fins F (directions between directions of extension of the fins F) can also be compared by calculating electric powers W. In the case of the pattern shown in FIG. 17 in which the fins F are formed along the direction from 0 degrees to 180 degrees, the above-described amounts of energy can be compared by calculating the total electric power in the IBE process when the grid 9 is positioned in the directions of 0 degrees to 45 degrees, 135 degrees to 225 degrees, and 315 degrees to 360 degrees in terms of substrate phase, and the total electric power in the IBE process when fire grid 9 is positioned in the directions of 45 degrees to 135 degrees, and 225 degrees to 315 degrees.

The above-described embodiments of the present invention can be variously changed without departing from the spirit of the present invention. Moreover, embodiments can also be appropriately combined as needed. For example, by combining the second embodiment with the fourth embodiment, the electric power supplied to the RF antenna 6 may be controlled in addition to the control of the rotational speed of the substrate holder 10 in accordance with the rotational phase of the substrate 11.

In each of the above-described embodiments, the comparison between the quantity of the ion beam incident in the extending direction of the fins F and the quantity of the ion beam incident in any other direction will be described with reference to FIG. 20.

Figure 20:
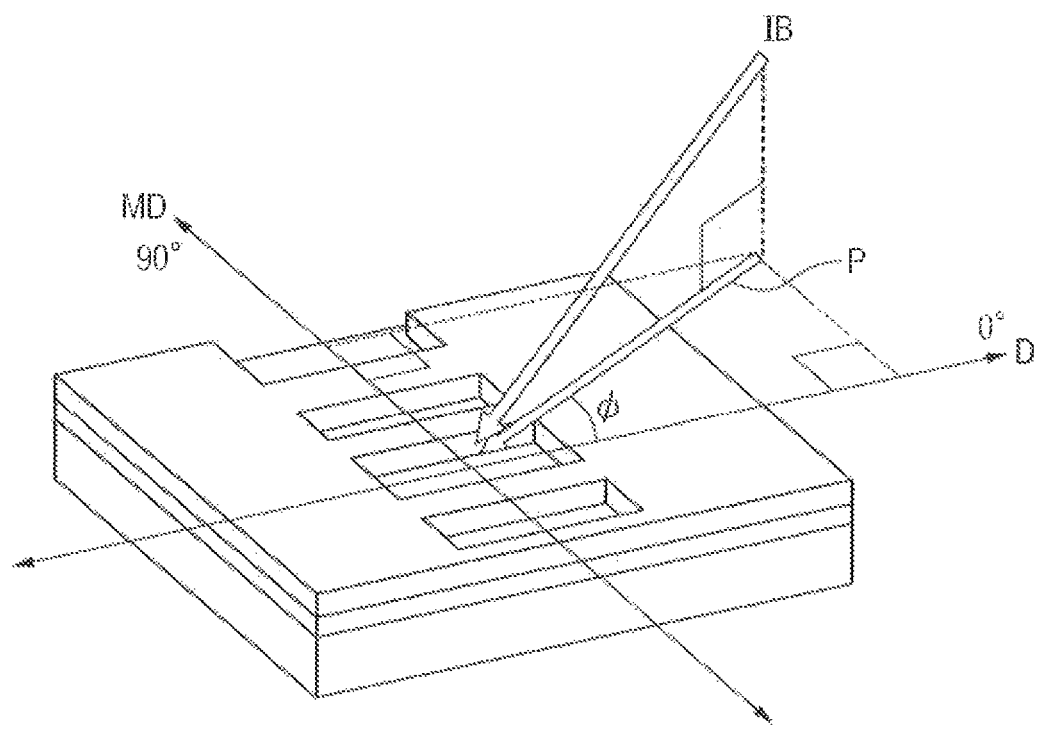
FIG. 20 is a view for explaining the relationship between the incident angle of the ion beam and the extending direction of the fins in the present invention.

First, as shown in FIG. 20, a line segment P is considered which is obtained by projecting the IB extracted from the grid 9 onto a plane containing the surface of the substrate 11. Then, the projected line segment P is decomposed into a component along directions D, in which the fins F extend, and a component along directions MD, which are intermediate between directions D. Finally, a comparison is made as to which of the component of the projected line segment along directions D and the component thereof along directions MD is larger.

In this embodiment, since angles on the substrate are defined, the directions from 0 degrees to 180 degrees and the direction from 180 degrees to 0 degrees are directions D in which the fins F extend. Further, the direction from 90 degrees to 270 degrees and the direction from 270 degrees to 90 degrees, which are intermediate between directions D, are directions MD.

Moreover, in each of the above-described, embodiments, the processing of side walls in I-shaped fin fabrication has been described. However, the shape of a fin is not limited to this. The present invention can be applied to fins having various shapes, e.g., a U-shaped fin such as shown in Patent Document 2.

The extending direction of fins may be appropriately changed in accordance with the arrangement of the fins. In each of the embodiments described previously, the fins are arranged along the direction from 0 degrees to 180 degrees. However, other than this, the present invention can also be applied to a substrate having fins extending in four directions, for example, such as disclosed JP-A 2011-233594. In this case, by performing control so that the IB quantity (amount of energy) may be oscillated at a frequency of four cycles per period of the substrate rotational phase, the side walls of the fins can be efficiently processed.

One embodiment of the present invention can be utilized not only in the fabrication of the illustrated fin FET but also in various devices such as an HDD magnetic head, an HDD magnetic recording medium, a magnetometric sensor, a light emitting element, a piezoelectric element, a phase change element, and a resistance change element. This is because after a predetermined pattern is formed in any of these devices, roughness existing in side walls thereof can be efficiently removed efficiently using an ion beam incident in the extending direction of the device.

Moreover, the present invention can be applied not only to the aforementioned processing of the side walls FS after the formation of the fins F but also to the processing of the side walls FS in other process step. For example, after the gate dielectric film 905 and the gate electrode 906 are formed on the fins F, and the gate dielectric film 905 and the gate electrode 906 in predetermined regions are removed, the present invention can also be used to remove residues of the gate dielectric film 905 and the gate electrode 906 adhering to the side walls FS.

What is claimed is:

1. A method of fabricating a fin FET, the method comprising the steps of:
   preparing a substrate which comprises a semiconductor fin thereon; and
   ion beam etching a side wall of the semiconductor fin using an ion beam extracted from a grid,
   wherein, in the ion etching step:
   the substrate is positioned with a tilt with respect to the grid;

the ion beam etching is performed with an amount of energy of the ion beam set such that an amount of energy of the ion beam incident in an extending direction of the fin is larger than an amount of energy of the ion beam incident in any other direction;

the substrate is rotated about an axis perpendicular to a plane of the substrate;

the substrate rotation involves repeating rotation and rotation stop; and rotation stop time of the substrate is longer when the grid is positioned in the extending direction of the fin, than when the grid is positioned in any other direction.

2. The method according to claim 1, wherein, in the ion beam etching step, electric power applied to a plasma source for producing the ion beam is controlled so that a density of ions in the ion beam is higher when the grid is positioned in an extending direction of a groove of the fin, than when the grid is positioned in any other direction.

3. The method according to claim 1, wherein the substrate is rotated with a tilt of 20 degrees to 80 degrees with respect to the grid.

4. The method according to claim 1, wherein a tilt angle of the substrate with respect to the grid is larger when the ion beam is incident in the extending direction of the fin, than when the ion beam is incident in any other direction.

5. The method according to claim 1, further comprising a step of performing reactive-ion etching for forming the fin before the ion beam etching step.

6. A method of fabricating a fin FET, the method comprising the steps of:

preparing a substrate which comprises a semiconductor fin thereon; and ion beam etching a side wall of the semiconductor fin using an ion beam extracted from a grid, wherein, in the ion etching step:

the substrate is positioned with a tilt with respect to the grid;

the ion beam etching is performed with an amount of energy of the ion beam set such that an amount of energy of the ion beam incident in an extending direction of the fin is larger than an amount of energy of the ion beam incident in any other direction;

the substrate is rotated about an axis perpendicular to a plane of the substrate;

the grid includes a first electrode subject to a positive voltage, a second electrode subject to a voltage lower than that at the first electrode and positioned closer to the substrate than the first electrode, and a ground electrode positioned closer to the substrate than the second electrode; and the voltage applied to the first electrode is higher when the grid is positioned in the extending direction of the fin, than when the grid is positioned in any other direction.

7. The method according to claim 6, wherein, in the ion etching step, a rotational speed of the substrate is lower when the grid is positioned in the extending direction of the fin, than when the grid is positioned in any other direction.

8. The method according to claim 6, wherein the substrate is rotated with a tilt of 20 degrees to 80 degrees with respect to the grid.

9. The method according to claim 6, wherein a tilt angle of the substrate with respect to the grid is larger when the ion beam is incident in the extending direction of the fin, than when the ion beam is incident in any other direction.

10. The method according to claim 6, further comprising a step of performing reactive-ion etching for forming the fin before the ion beam etching step.

* * * * *